United States Patent
Kim et al.

(10) Patent No.: US 11,922,064 B2
(45) Date of Patent: Mar. 5, 2024

(54) STORAGE DEVICE AND OPERATING METHOD THEREOF

(71) Applicant: SK hynix Inc., Gyeonggi-do (KR)

(72) Inventors: Soo Jin Kim, Gyeonggi-do (KR); Seung Jin Park, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 233 days.

(21) Appl. No.: 17/483,119

(22) Filed: Sep. 23, 2021

(65) Prior Publication Data

US 2022/0317933 A1    Oct. 6, 2022

(30) Foreign Application Priority Data

Apr. 5, 2021    (KR) .................... 10-2021-0044286

(51) Int. Cl.
| | |
|---|---|
| G11C 7/00 | (2006.01) |
| G06F 3/06 | (2006.01) |
| G11C 7/10 | (2006.01) |
| G11C 16/04 | (2006.01) |
| G11C 16/10 | (2006.01) |
| G11C 16/26 | (2006.01) |

(52) U.S. Cl.
CPC .......... G06F 3/0659 (2013.01); G06F 3/0604 (2013.01); G06F 3/0673 (2013.01); G11C 7/1036 (2013.01); G11C 16/0483 (2013.01); G11C 16/10 (2013.01); G11C 16/26 (2013.01)

(58) Field of Classification Search
CPC ....... G11C 7/22; G11C 7/1006; G11C 7/1051; G11C 7/1078; G11C 8/04; G11C 11/4076
USPC .............................. 365/193, 189.12
See application file for complete search history.

(56) References Cited

U.S. PATENT DOCUMENTS

| | | | |
|---|---|---|---|
| 6,762,973 B2* | 7/2004 | Shu ...................... | G11C 7/22 |
| | | | 365/189.05 |
| 9,449,665 B1* | 9/2016 | Kim ...................... | G11C 7/10 |
| 2020/0058344 A1* | 2/2020 | Vankayala .......... | G11C 11/4076 |

FOREIGN PATENT DOCUMENTS

| | | |
|---|---|---|
| KR | 1020130137310 A | 12/2013 |
| KR | 1020140088730 A | 7/2014 |

* cited by examiner

*Primary Examiner* — Son T Dinh
(74) *Attorney, Agent, or Firm* — IP & T GROUP LLP

(57) ABSTRACT

A storage device can control the input/output of data at a high frequency. The storage device includes a memory device and a memory controller for controlling the memory device, and providing the memory device with a command. The memory device includes a memory unit, and an interface chip for performing a training operation in response to the command. The interface chip generates a shift signal according to a first data strobe signal provided from the memory controller, and stores, based on the shift signal, training data provided from the memory controller.

20 Claims, 17 Drawing Sheets

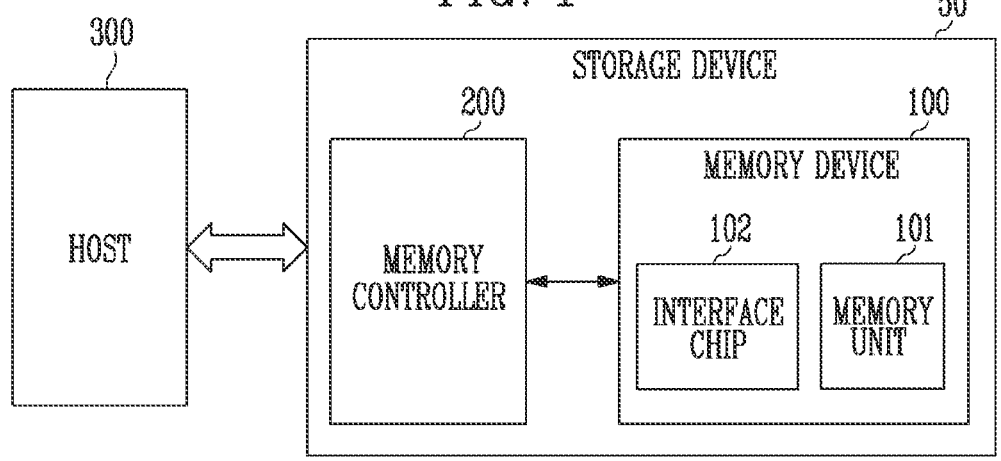
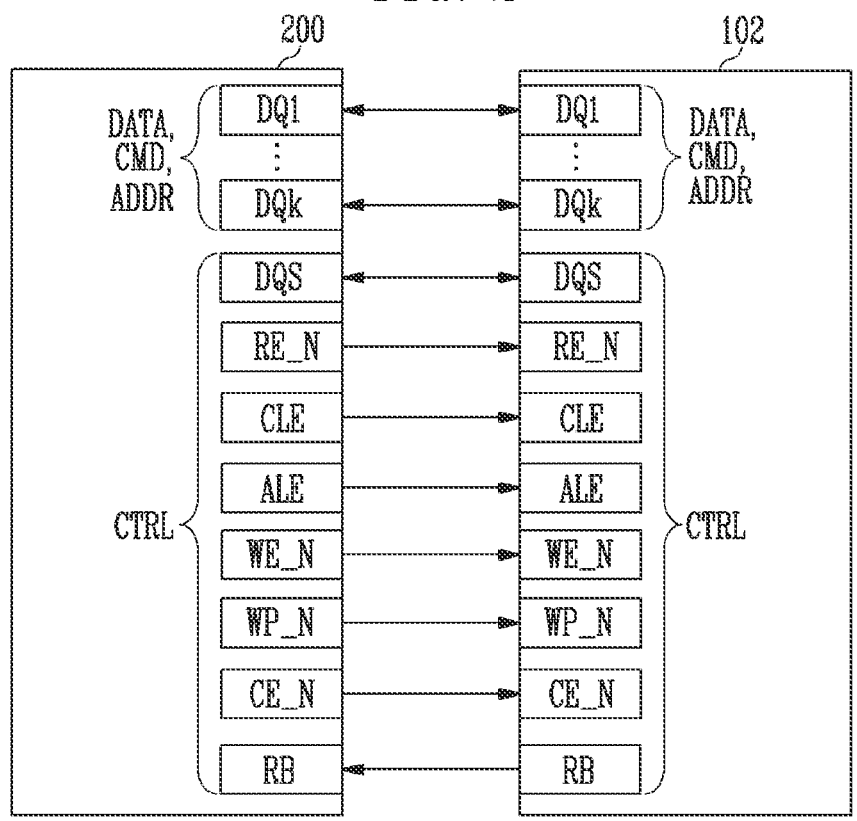

STORAGE DEVICE AND OPERATING METHOD THEREOF

CROSS-REFERENCE TO RELATED APPLICATION

The present application claims priority under 35 U.S.C. § 119(a) to Korean patent application number 10-2021-0044286 filed on Apr. 5, 2021, the entire disclosure of which is incorporated by reference herein.

BACKGROUND

Field of Invention

The present disclosure generally relates to an electronic device, and more particularly, to a storage device and an operating method thereof.

Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments of the present disclosure provide a storage device capable of controlling the input/output of data at a high frequency, and an operating method of the storage device.

In accordance with an aspect of the present disclosure, there is provided a storage device including: a memory device; and a memory controller configured to control the memory device, and provide the memory device with a command, wherein the memory device includes: a memory unit; and an interface chip configured to perform a training operation in response to the command by: generating a shift signal according to a first data strobe signal provided from the memory controller, and storing, based on the shift signal, training data provided from the memory controller.

In accordance with another aspect of the present disclosure, there is provided a method for operating a storage device, the method including: receiving a command and training data; generating a first shift signal according to a first data strobe signal in response to the command; storing the training data based on the first shift signal; generating a second shift signal according to a read enable signal and a second data strobe signal; and outputting the stored training data based on the second shift signal.

In accordance with another aspect of the present disclosure, there is provided an operating method of a memory device, the operating method including: sequentially storing a data sequence into a first register circuitry according to a first shift signal, which is output from a first shift register and has a changing value according to a data strobe signal, during a write training operation; moving the data sequence from the first register circuitry to a second register circuitry during a read training operation; and sequentially outputting the data sequence from the second register circuitry according to a second shift signal, which is output from a second shift register and has a changing value according to the data strobe signal, during the read training operation.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a diagram illustrating a storage device in accordance with an embodiment of the present disclosure.

FIG. 2 is a block diagram illustrating a connection relationship between a memory controller and an interface chip in accordance with an embodiment of the present disclosure.

DETAILED DESCRIPTION

Figure 3:
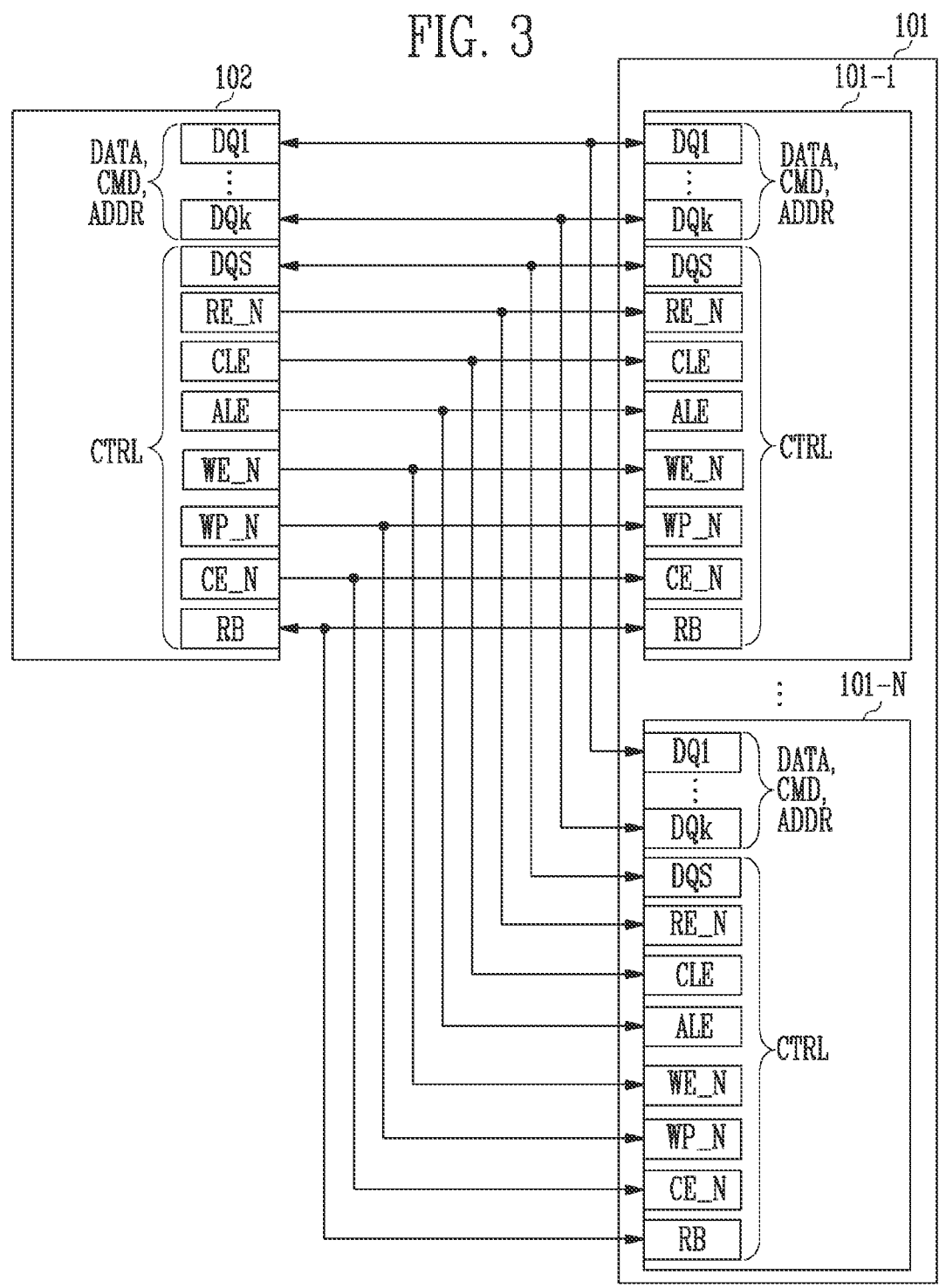
FIG. 3 is a block diagram illustrating a connection relationship between the interface chip and a memory unit in accordance with an embodiment of the present disclosure.

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

FIG. 1 is a diagram illustrating a storage device 50 in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment system.

The storage device 50 may be manufactured as any of various types of storage devices according to a host interface that is a communication scheme with the host 300. For example, the storage device 50 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any of various package types. For example, the storage device 50 may be manufactured as any various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may be configured as any of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (SU-RAM), or the like. In this specification, for convenience of description, a case where the memory device 100 is a NAND flash memory is described.

The memory device 100 may receive a command and an address from the memory controller 200, and access a zone selected by the address in the memory cell array. The memory device 100 may perform an operation indicated by the command on the zone selected by the address. For example, the memory device 100 may perform a write operation (program operation), a read operation, and an erase operation. In the program operation, the memory device 100 may program data in the zone selected by the address. In the read operation, the memory device 100 may read data from the zone selected by the address. In the erase operation, the memory device 100 may erase data stored in the zone selected by the address.

For example, the memory device 100 may receive, from the memory controller 200, at least one of a chip select signal for selecting a memory unit 101 constituting the memory device 100, a command latch enable signal indicating that a signal received from the memory controller 200 is a command, an address latch enable signal indicating that a signal received from the memory controller 200 is an address, a read enable signal which is generated by the memory controller 200 in a read operation and is periodically toggled to be used to set a timing, a write enable signal activated by the memory controller 200 when a command or address is transmitted, a write prevention signal activated by the memory controller 200 to prevent unintended write or erase when power is changed, and a data strobe signal which is generated by the memory controller 200 in a write operation and is periodically toggled to be used to set an input sync of data.

In an embodiment, the memory device 100 may output, to the memory controller 200, at least one of a ready and busy signal indicating whether the memory device 100 is performing any operation among write, erase, and read operations and a data strobe signal which is generated from the read enable signal received from the memory controller 200 by the memory device 100 and is periodically toggled to be used to set an output sync of data.

The memory device 100 may include the memory unit 101 and an interface chip 102. The memory unit 101 may communicate with the memory controller 200 through the interface chip 102. The interface chip 102 may mediate communication between the memory unit 101 and the memory controller 200. Also, the interface chip 102 may perform retiming on a command and data, which are exchanged between the memory controller 200 and the memory unit 101. The retiming may include buffering data or a command provided from the memory controller 200.

When the data or the command is buffered, the output timing of the data or the command is realigned, and the skew of the data or the command decreases. That is, interface chip 102 adjusts the output timing of the data and the command, which are exchanged between the memory controller 200 and the memory unit 101, thereby improving the reliability of the storage device 50.

Also, the interface chip 102 may perform a training operation in response to a specific command received from the memory controller 200. The training operation of the interface chip 102 is used to adjust an operation timing between a clock, a data strobe signal, and data, which are required in a data transmission operation between the memory controller 200 and the interface chip 102. The training operation of the interface chip 102 is used to measure and correct timing distortion (i.e., skew) among the clock, the data strobe signal, and the data in various environments as the speed of data transmission between the memory controller 200 and the interface chip 102 becomes fast. Thus, the reliability of a data transmission operation between the memory controller 200 and the interface chip 102 can be improved through the training operation of the interface chip 102.

For example, the interface chip 102 may perform a write training operation and a read training operation. That is, the interface chip 102 may perform a write training operation of measuring a degree to which timings of internal clocks and data of the interface chip 102 are mismatched in a write operation and then correcting the mismatch by storing training data in the interface chip 102 in response to a specific command received from the memory controller 200. Also, the interface chip 102 may perform a read training operation of measuring a degree to which timings of internal clocks and data of the interface chip 102 are mismatched in a read operation and then correcting the mismatch by reading training data stored in the interface chip 102 and by outputting the read training data to the memory controller 200.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving scheme to improve operational performance. The interleaving scheme may be a scheme for controlling operations on at least two memory devices 100 to overlap with each other.

The host 300 may communicate with the storage device 50, using at least one of various communication standards or interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

FIG. 2 is a block diagram illustrating a connection relationship between the memory controller 200 and the interface chip 102 in accordance with an embodiment of the present disclosure.

Referring to FIG. 2, each of the memory controller 200 and the interface chip 102 may exchange data DATA, a command CMD, and an address ADDR through a common channel. Each of the memory controller 200 and the interface chip 102 may include first to kth input/output pads DQ1 to DQk. The memory controller 200 and the interface chip 102 may exchange data DATA, a command CMD, and an address ADDR through the first to kth input/output pads DQ1 to DQk. For example, a signal transmitted through the first to kth input/output pads DQ1 to DQk may be identified as any of the data DATA, the command CMD, and the address ADDR according to the type of a control signal CTRL. For example, the number of the first to kth input/output pads DQ1 to DQk may be 8, 16 or 32, but the present disclosure is not limited thereto.

The memory controller 200 and the interface chip 102 may exchange the control signal CTRL. Each of the memory controller 200 and the interface chip 102 may include a plurality of pads for respectively exchanging a data strobe signal DQS, a read enable signal RE_N, a command latch enable signal CLE, an address latch enable signal ALE, a write enable signal WE_N, a write prevention signal WP_N, a chip enable signal CE_N, and a ready and busy signal RB.

For example, when the memory controller 200 activates (e.g., logic low) the chip enable signal CE_N, activates (e.g., logic high) the command latch enable signal CLE, inactivates (e.g., logic low) the address latch enable signal ALE, and activates (e.g., logic low) and then inactivates (e.g., logic high) the write enable signal WE_N, the memory controller 200 may output a command CMD. In addition, the interface chip 102 or the memory unit 101 may identify that the command CMD is received through the first to kth input/output pads DQ1 to DQk.

For example, when the memory controller 200 activates (e.g., logic low) the chip enable signal CE_N, inactivates (e.g., logic low) the command latch enable signal CLE, activates (e.g., logic high) the address latch enable signal ALE, and activates (e.g., logic low) and then inactivates (e.g., logic high) the write enable signal WE_N, the memory controller 200 may output an address ADDR through the first to kth input/output pads DQ1 to DQk. In addition, the interface chip 102 or the memory unit 101 may identify that the address ADDR is received through the first to kth input/output pads DQ1 to DQk.

For example, when the memory controller 200 activates (e.g., logic low) the chip enable signal CE_N, inactivates (e.g., logic low) the command latch enable signal CLE, inactivates (e.g., logic low) the address latch enable signal ALE, inactivates (e.g., logic high) the write enable signal WE_N, and inactivates (e.g., logic high) the read enable signal RE_N, the memory controller 200 may generate a periodically toggled data strobe signal DQS, and be synchronized with the data strobe signal DQS to output data DATA through the first to kth input/output pads DQ1 to DQk. The interface chip 102 or the memory unit 101 may be synchronized with the data strobe signal DQS to identify that the data DATA is received through the first to kth input/output pads DQ1 to DQk.

For example, the memory controller 200 may activate (e.g., logic low) the chip enable signal CE_N, inactivate (e.g., logic low) the command latch enable signal CLE, inactivate (e.g., logic low) the address latch enable signal ALE, inactivate (e.g., logic high) the write enable signal WE_N, and periodically toggle the read enable signal RE_N. The interface chip 102 or the memory unit 101 may generate a periodically toggled data strobe signal DQS from the periodically toggled read enable signal RE_N. The interface chip 102 or the memory unit 101 may be synchronized with the data strobe signal DQS to output data DATA through the first to kth input/output pads DQ1 to DQk. The memory controller 200 may be synchronized with the data strobe signal DQS to identify that the data DATA is received through the first to kth input/output pads DQ1 to DQk.

FIG. 3 is a block diagram illustrating a connection relationship between the interface chip 102 and the memory unit 101 in accordance with an embodiment of the present disclosure.

Referring to FIG. 3, the memory unit 101 may include a plurality of memory chips 101_1 to 101_N. For example, each of the plurality of memory chips 101_1 to 101_N may be configured as one semiconductor chip.

Each of the interface chip 102 and the plurality of memory chips 101_1 to 101_N may include first to kth input/output pads DQ1 to DQk. First to kth input/output pads DQ1 to DQk of the plurality of memory chips 101_1 to 101_N may be commonly connected to first to kth input/output pads DQ1 to DQk of the interface chip 102. The interface chip 102 and the plurality of memory chips 101_1 to 101_N may exchange data DATA, a command CMD, and an address ADDR through the first to kth input/output pads DQ1 to DQk. For example, a signal transmitted through the first to kth input/output pads DQ1 to DQk may be identified as the data DATA, the command CMD, or the address ADDR according to the type of a control signal CTRL. For example, the number of the first to kth input/output pads DQ1 to DQk may be 8, 16 or 32, but the present disclosure is not limited thereto.

The interface chip 102 and the plurality of memory chips 101_1 to 101_N may exchange the control signal CTRL. The interface chip 102 may include a plurality of pads for respectively exchanging a data strobe signal DQS, a read enable signal RE_N, a command latch enable signal CLE, an address latch enable signal ALE, a write enable signal WE_N, a write prevention signal WP_N, a chip enable signal CE_N, and a ready and busy signal RB.

Each of the plurality of memory chips 101_1 to 101_N may include a plurality of pads for respectively exchanging a data strobe signal DQS, a read enable signal RE_N, a command latch enable signal CLE, an address latch enable signal ALE, a write enable signal WE_N, a write prevention signal WP_N, a chip enable signal CE_N, and a ready and busy signal RB.

The plurality of memory chips 101_1 to 101_N may respectively exchange the data strobe signal DQS, the read enable signal RE_N, the command latch enable signal CLE, the address latch enable signal ALE, a write enable signal WE_N, and a write prevention signal WP_N with the interface chip 102 through a common channel.

Each of the plurality of memory chips 101_1 to 101_N may receive the chip enable signal CE_N from the interface chip 102, and output the ready and busy signal RB to the interface chip 102. The plurality of memory chips 101_1 to 101_N may respectively receive chip enable signals CE_N from different pads of the interface chip 102. The plurality of memory chips 101_1 to 101_N may respectively transmit the ready and busy signal RB to different pads of the interface chip 102.

Figure 4:
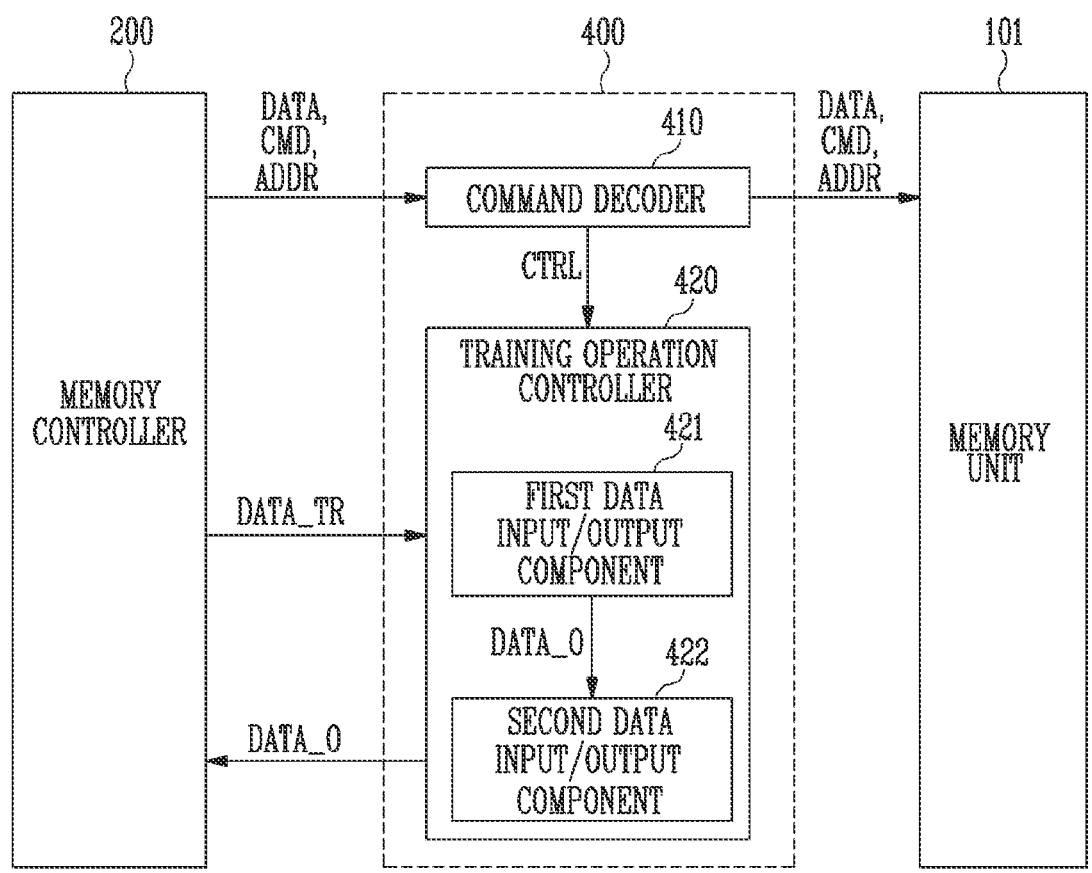
FIG. 4 is a diagram illustrating an interface chip in accordance with an embodiment of the present disclosure.

FIG. 4 is a diagram illustrating an interface chip in accordance with an embodiment of the present disclosure.

The interface chip 400 shown in FIG. 4 may represent the interface chip 102 described with reference to FIGS. 1 to 3.

Referring to FIG. 4, the interface chip 400 may include a command decoder 410 and a training operation controller 420.

The command decoder 410 may sense a command CMD provided from the memory controller 200. For example, the command decoder 410 may receive the command, an address ADDR, and data DATA from the memory controller 200.

In an embodiment, when the command CMD is a command for a normal operation, the command decoder 410 may provide the memory unit 101 with the command, the address ADDR, and the data DATA.

In an embodiment, when the command decoder 410 senses a specific command for a training operation, the command decoder 410 may output a training operation control signal CTRL to perform a training operation. For example, the memory controller 200 may provide the interface chip 400 with a specific command for the training operation. The command decoder 410 may provide the training operation control signal CTRL to the training operation controller 420 in response to the specific command.

In an embodiment, the command decoder 410 may block the specific command and training data DATA_TR from being transmitted to the memory unit 101 in response to the specific command. That is, when a specific command is received from the memory controller 200, the interface chip 400 may block the specific command from being transmitted to the memory unit 101 to prevent the memory device 100 from malfunctioning as the specific command is transmitted to the memory unit 101.

The training operation controller 420 may control a write operation and a read operation, which correspond to the training operation, according to the training operation control signal CTRL.

In an embodiment, the training operation controller 420 may include a first data input/output component 421 and a second data input/output component 422.

The first data input/output component 421 may generate a shift signal according to a first data strobe signal, and store training data DATA_TR based on the shift signal. That is, the first data input/output component 421 may store the training data DATA_TR in a corresponding storage register according the output of a shift register.

The second data input/output component 422 may receive and store output data DATA_O having a predetermined size and provided from the first data input/output component 421. The data DATA_O may be the training data DATA_TR output from the first data input/output component 421. Also, the second data input/output component 422 may generate a shift signal according to a read enable signal and a second data strobe signal, which are provided from the memory controller 200, and shift and output the stored output data DATA_O in response to the shift signal. That is, the second data input/output component 422 may output data stored in a corresponding storage register according to the output of a shift register.

In an embodiment, the training operation controller 420 may set a delay time by comparing the training data DATA_TR and the shifted output data DATA_O, and perform a write operation and a read operation, which correspond to the normal operation, based on the set delay time.

Figure 5:
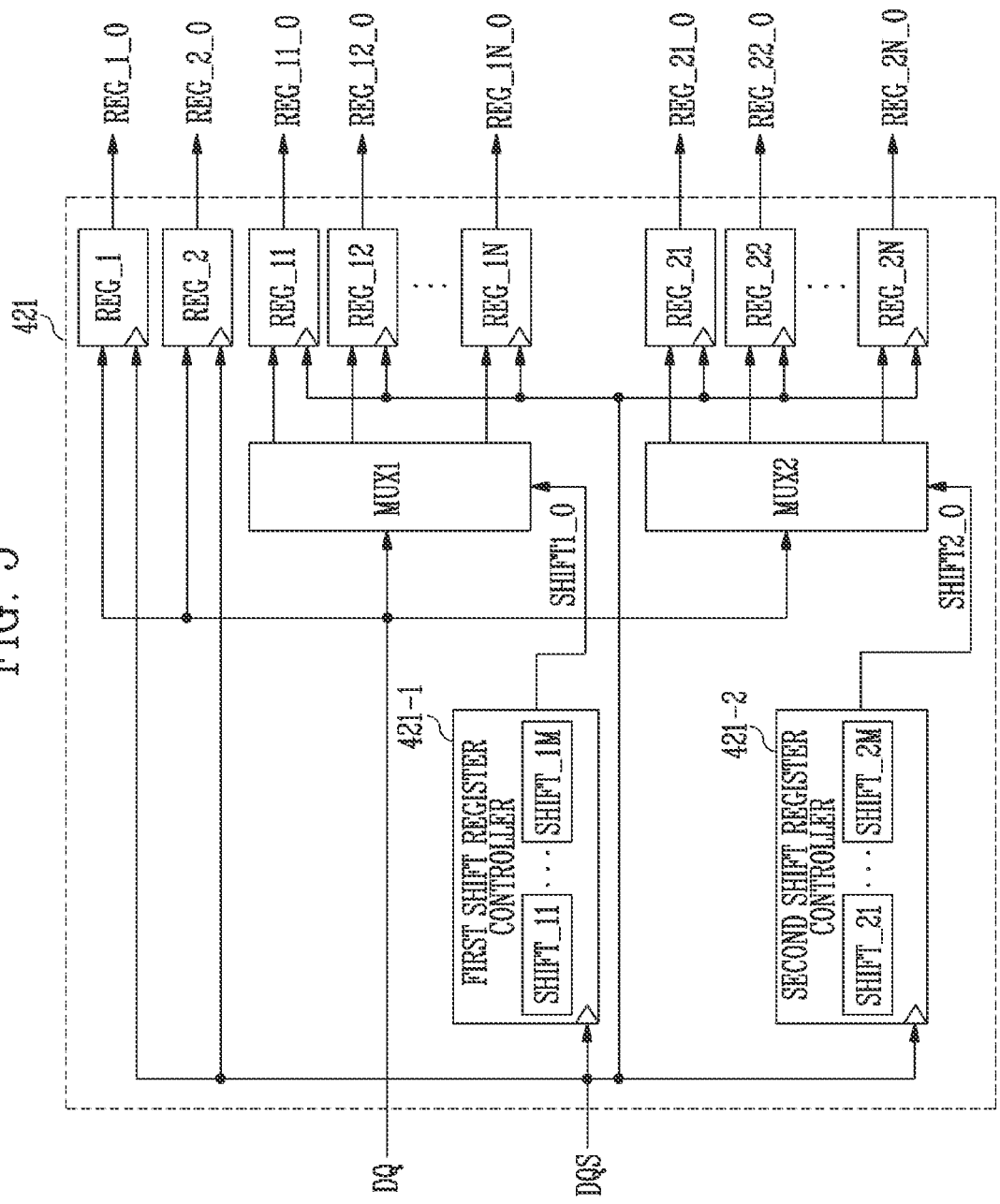
FIG. 5 is a diagram illustrating a first data input/output component in accordance with an embodiment of the present disclosure.

FIG. 5 is a diagram illustrating a first data input/output component 421 in accordance with an embodiment of the present disclosure.

Figure 6:
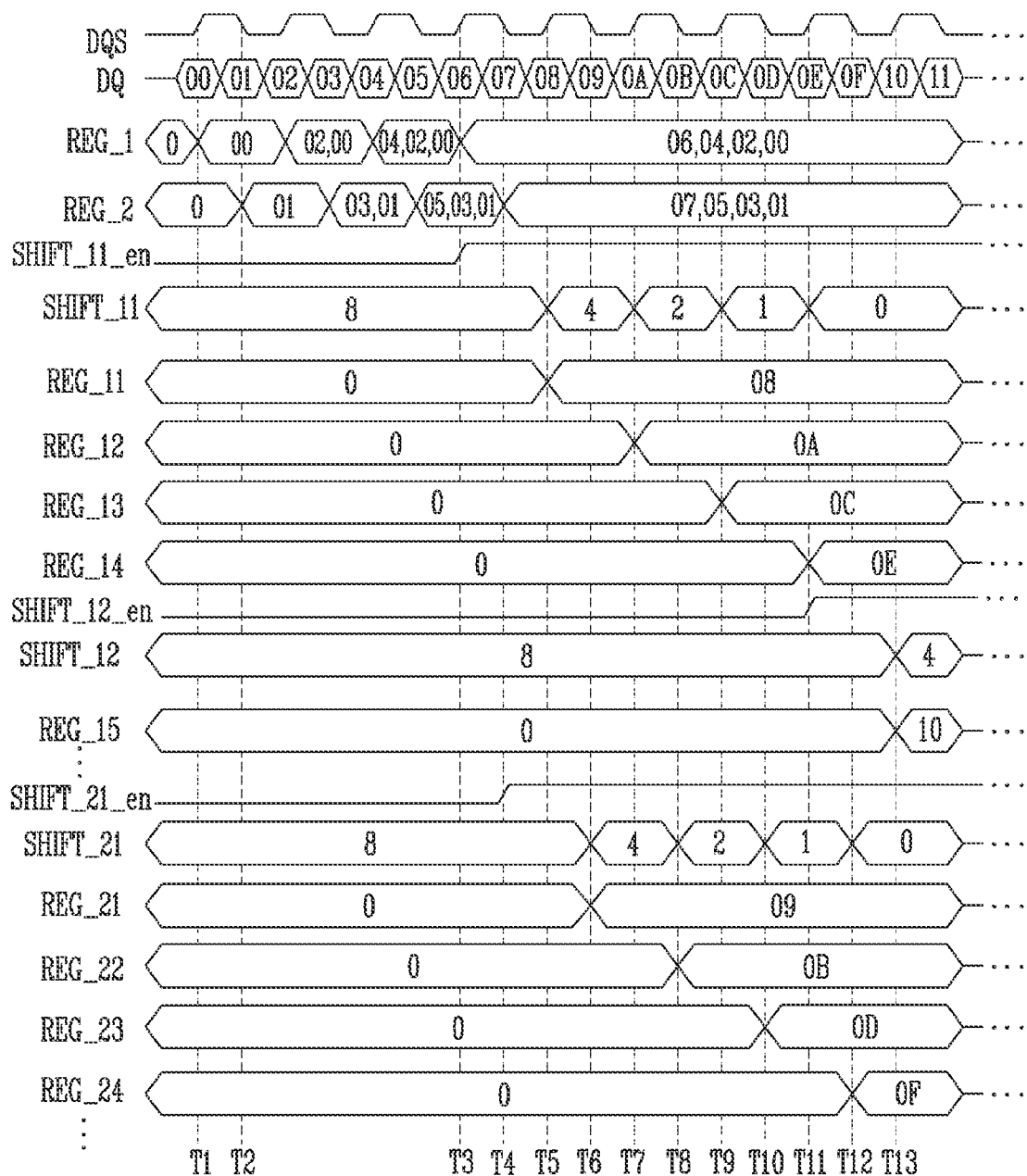
FIG. 6 is a timing diagram illustrating an operation of the first data input/output component in accordance with an embodiment of the present disclosure.

FIG. 6 is a timing diagram illustrating an operation of the first data input/output component 421 in accordance with an embodiment of the present disclosure.

Referring to FIGS. 5 and 6, the first data input/output component 421 may include a first shift register controller 421-1, a second shift register controller 412-2, a first multiplexer MUX1, a second multiplexer MUX2, and a plurality of storage registers REG_1, REG_2, REG_11 to REG1N, and REG_21 to REG_2N.

A storage register REG_1 may store training data having a predetermined size in response to a rising edge of a first data strobe signal DQS.

In addition, a storage register REG_2 may store training data having a predetermined size in response to a falling edge of the first data strobe signal DQS.

In an embodiment, the first data input/output component 421 may store training data having a predetermined size respectively in the storage register REG_1 and the storage register REG_2 and then store training data in the other storage registers REG_11 to REG_1N and REG_21 to REG_2N. In an embodiment, the predetermined size may be 32 bits, but the present disclosure is not limited thereto.

For example, the storage register REG_1 may store training data 00, 02, 04, and 06 input through an input/output line DQ in response to rising edges of the first data strobe signal DQS during T1 to T3. The storage register RGE_1 may sequentially shift and store the training data 02, 04, and 06 in an order in which the training data 00, 02, 04, and 06 are input. Accordingly, after T3, the storage register REG_1 may complete storing all of the training data 00, 02, 04, and 06 having the predetermined size.

In addition, the storage register REG_2 may store training data 01, 03, 05, and 07 input through the input/output line DQ in response to falling edges of the first data strobe signal DQS during T2 to T4. The storage register REG_2 may sequentially shift and store the training data 01, 03, 05, and 07 in an order in which the training data 01, 03, 05, and 07 are input. Accordingly, after T4, the storage register REG_2 may complete storing all of the training data 01, 03, 05, and 07 having the predetermined size.

The first shift register controller 421-1 may control a plurality of first shift registers SHIFT_11 to SHIFT_1M, which output a shift signal SHIFT1_0 in response to a rising edge of the first data strobe signal DQS. In an embodiment, the shift register may be a register which sequentially shifts and stores bits according to an input signal. For example, first shift registers SHIFT_11 to SHIFT_1M may output the shift signal SHIFT1_0 and then sequentially shift the stored bits. In an embodiment, the shift signal SHIFT1_0 may represent a value stored in the first shift registers SHIFT_11 to SHIFT_1M. The first shift registers SHIFT_11 to SHIFT_1M correspond to a register having a 4-bit size, but the present disclosure is not necessarily limited thereto.

A plurality of storage registers REG_11 to REG_1N may respectively store training data based on a corresponding shift signal SHIFT1_0 among shift signals output from the plurality of first shift registers SHIFT_11 to SHIFT_1M.

The first multiplexer MUX1 may output training data to a storage register among the plurality of storage registers REG_11 to REG_1N in response to the shift signal SHIFT1_0. For example, the first multiplexer MUX1 may output training data received through the input/output line DQ to any of the plurality of storage registers REG_11 to REG_1N according to the shift signal SHIFT1_0.

For example, after the training data 00, 02, 04, and 06 having the predetermined size are stored in the storage register REG_1 at T3, the first shift register controller 421-1 may generate a signal SHIFT_11_en for activating a first shift register SHIFT_11. At T5, the first multiplexer MUX 1 may receive training data 08 through the input/output line DQ. At T5, the first shift register controller 421-1 provides a shift signal SHIFT1_0 of the first shift register SHIFT_11 to the first multiplexer MUX1 according to a rising edge. The first shift register SHIFT_11 stores '1000' as a binary data value, and therefore, the shift signal SHIFT1_0 of the first shift register SHIFT_11 may be 8. The first multiplexer MUX1 may output the training data 08 to the storage register REG_11 in response to the shift signal SHIFT1_0. The storage register REG_11 may store the training data 08. The first shift register SHIFT_11 outputs the shift signal SHIFT1_0 and then stores '0100' as a binary data value by shifting each bit. Therefore, the shift signal SHIFT1_0 of the first register SHIFT_11 may be changed to 4.

In addition, at T7, the first multiplexer MUX1 may receive training data 0A through the input/output line DQ. At T7, the first shift register controller 421-1 may provide the shift signal SHIFT1_0 of the first shift register SHIFT_11 to the first multiplexer MUX1 according to a rising edge. The first shift register SHIFT_11 stores '0100' as the binary data value, and therefore, the shift signal SHIFT1_0 of the first shift register SHIFT_11 may be 4. The first multiplexer MUX1 may output the training data 0A to a storage register REG_12 in response to the shift signal SHIFT1_0. The storage register REG_12 may store the training data 0A. The first shift register SHIFT_11 outputs the shift signal SHIFT1_0 and then stores '0010' as a binary data value by shifting each bit. Therefore, the shift signal SHIFT1_0 of the first shift register SHIFT_11 may be changed to 2.

In addition, at T9, the first multiplexer MUX1 may receive training data 0C through the input/output line DQ. At T9, the first shift register controller 421-1 may provide the shift signal SHIFT1_0 of the first shift register SHIFT_11 to the first multiplexer MUX1 according to a rising edge. The first shift register SHIFT_11 stores '0010' as the binary data value, and therefore, the shift signal SHIFT1_0 of the first shift register SHIFT_11 may be 2. The first multiplexer MUX1 may output the training data 0C to a storage register REG_13 in response to the shift signal SHIFT1_0. The storage register REG_13 may store the training data 0C. The first shift register SHIFT_11 outputs the shift signal SHIFT1_0 and then stores '0001' as a binary data value by shifting each bit. Therefore, the shift signal SHIFT1_0 of the first shift register SHIFT_11 may be changed to 1.

In addition, at T11, the first multiplexer MUX1 may receive training data 0E through the input/output line DQ. At T11, the first shift register controller 421-1 may provide the shift signal SHIFT1_0 of the first shift register SHIFT_11 to the first multiplexer MUX1 according to a rising edge. The first shift register SHIFT_11 stores '0001' as the binary data value, and therefore, the shift signal SHIFT1_0 of the first shift register SHIFT_11 may be 1. The first multiplexer MUX1 may output the training data 0E to a storage register REG_14 in response to the shift signal SHIFT1_0. The storage register REG_14 may store the training data 0E. The first shift register SHIFT_11 outputs the shift signal SHIFT1_0 and then stores '0000' as a binary data value by shifting each bit. Therefore, the shift signal SHIFT1_0 of the first shift register SHIFT_11 may be changed to 0.

In an embodiment, the first shift register controller 421-1 may control another first shift register, when bits stored in a currently controlled first shift register among the plurality of first shift registers SHIFT_11 to SHIFT_1M represent a predetermined value. For example, the first shift register controller 421-1 may control another first shift register, when the bits stored in the currently controlled first shift register represent 0. That is, one first shift register may control four storage registers. However, the number of storage registers controlled by the one first shift register may vary.

For example, at T11, when the value of the currently controlled first shift register SHIFT_11 represents 0, the first shift register controller 421-1 may control another first shift register SHIFT_12. Specifically, at T11, the first shift register controller 421-1 may generate a signal SHIFT_12_en for activating the first shift register SHIFT_12. In an embodiment, the first shift register SHIFT_12 may control four storage registers REG_15 to REG_18. Subsequently, from T13 as a next rising edge, the first shift register SHIFT_12 may control the storage registers REG_15 to REG_18 for every rising edge.

As described above, the first shift register controller 421-1 may sequentially activate the plurality of first shift registers SHIFT_11 to SHIFT_1M. In addition, the plurality of sequentially activated first shift registers SHIFT_11 to SHIFT_1M may respectively control corresponding storage registers REG_11 to REG_1N.

An operation of the first shift register SHIFT_11 and the storage registers REG_11 to REG_14, which are described in the above-described example, may be equally applied to the other first shift registers SHIFT_12 to SHIFT_1M and the other storage registers REG_15 to REG_1N.

The second shift register controller 421-2 may control a plurality of second shift registers SHIFT_21 to SHIFT_2M which output a shift signal SHIFT2_0 in response to a falling edge of the first data strobe signal DQS. For example, the second shift registers SHIFT_21 to SHIFT_2M may output the shift signal SHIFT2_0 and then sequentially shift stored bits. In an embodiment, the shift signal SHIFT2_0 may represent a value stored in the second shift registers SHIFT_21 to SHIFT_2M. The second shift registers SHIFT_21 to SHIFT_2M may correspond to a register having a 4-bit size, but the present disclosure is not limited thereto.

A plurality of storage registers REG_21 to REG_2N may respectively store training data based on a corresponding shift signal SHIFT2_0 among shift signals output from the plurality of second shift registers SHIFT_21 to SHIFT_2M.

The second multiplexer MUX2 may output training data to a storage register in response to the shift signal SHIFT2_0 among the plurality of storage registers REG_21 to REG_2N. For example, the second multiplexer MUX2 may output training data received through the input/output line DQ to any of the plurality of storage registers REG_21 to REG_2N according to the shift signal SHIFT2_0.

For example, after training data 01, 03, 05, and 07 having a predetermined size are stored in the storage register REG_2 at T4, the second shift register controller 421-2 may generate a signal SHIFT_21_en for activating a second shift register SHIFT_21. At T6, the second multiplexer MUX2 may receive training data 09 through the input/output line DQ. At T6, the second shift register controller 421-2 may provide a shift signal SHIFT2_0 of the second shift register SHIFT_21 to the second multiplexer MUX2 according to a falling edge. The second shift register SHIFT_21 stores '1000' as a binary data value, and therefore, the shift signal SHIFT2_0 of the second shift register SHIFT_21 may be 8. The second multiplexer MUX2 may output the training data 09 to a storage register REG_21 in response to the shift signal SHIFT2_0. The storage register REG_21 may store the training data 09. The second shift register SHIFT_21 outputs the shift signal SHIFT2_0 and then stores '0100' as a binary data value by shifting each bit. Therefore, the shift signal SHIFT2_0 of the second shift register SHIFT_21 may be changed to 4.

In addition, at T8, the second multiplexer MUX2 may receive training data 0B through the input/output line DQ. At T8, the second shift register controller 421-2 may provide the shift signal SHIFT2_0 of the second shift register SHIFT_21 to the second multiplexer MUX2 according to a falling edge. The second shift register SHIFT_21 stores '0100' as the binary data value, and therefore, the shift signal SHIFT2_0 of the second shift register SHIFT_21 may be 4. The second multiplexer MUX2 may output the training data 0B to a storage register REG_22 in response to the shift signal SHIFT2_0. The storage register REG_22 may store the training data 0B. The second shift register SHIFT_21 outputs the shift signal SHIFT2_0 and then stores '0010' as a binary data value by shifting each bit. Therefore, the shift signal SHIFT2_0 of the second shift register SHIFT_21 may be changed to 2.

In addition, T10, the second multiplexer MUX2 may receive training data 0D through the input/output line DQ. At T10, the second shift register controller 421-2 may provide the shift signal SHIFT2_0 of the second shift register SHIFT_21 to the second multiplexer MUX2 according to a falling edge. The second shift register SHIFT_21 stores '0010' as the binary data value, and therefore, the shift signal SHIFT2_0 of the second shift register SHIFT_21 may be 2. The second multiplexer MUX2 may output the training data 0D to a storage register REG_23 in response to the shift signal SHIFT2_0. The storage register REG_23 may store the training data 0D. The second shift register SHIFT_21 outputs the shift signal SHIFT2_0 and then stores '0001' as a binary data value by shifting each bit. Therefore, the shift signal SHIFT2_0 of the second shift register SHIFT_21 may be changed to 1.

In addition, at T12, the second multiplexer MUX2 may receive training data 0F through the input/output line DQ. At T12, the second shift register controller 421-2 may provide the shift signal SHIFT2_0 of the second shift register SHIFT_21 to the second multiplexer MUX2 according to a falling edge. The second shift register SHIFT_21 stores '0001' as the binary data value, and therefore, the shift signal SHIFT2_0 of the second shift register SHIFT_21 may be 1. The second multiplexer MUX2 may output the training data 0F to a storage register REG_24 in response to the shift signal SHIFT2_0. The storage register REG_24 may store the training data 0F. The second shift register SHIFT_21 outputs the shift signal SHIFT2_0 and then stores '0000' as a binary data value by shifting each bit. Therefore, the shift signal SHIFT2_0 of the second shift register SHIFT_21 may be changed to 0.

In an embodiment, the second shift register controller 421-2 may control another second shift register, when bits stored in a currently controlled second shift register among the plurality of second shift registers SHIFT_21 to SHIFT_2M represent a predetermined value. For example, the second shift register controller 421-2 may control another second shift register, when the bits stored in the currently controlled second shift register represent 0. That is, one second shift register may control four storage registers. However, the number of storage registers controlled by the one second shift register may vary.

For example, at T12, the value of the currently controlled second shift register SHIFT_21 represents 0, and therefore, the second shift register controller 421-2 may control another second shift register SHIFT_22. Specifically, at T12, the second shift register controller 421-2 may generate a signal SHIFT_22_en for activating the second shift register SHIFT_22. In an embodiment, the second shift register SHIFT_22 may control four storage registers REG_25 to REG_28. Subsequently, from a next falling edge, the second shift register SHIFT_22 may control the storage registers REG_25 to REG_28 for every falling edge.

As described above, the second shift register controller 421-2 may sequentially activate the plurality of second shift registers SHIFT_21 to SHIFT_2M. In addition, the plurality of sequentially activated second shift registers SHIFT_21 to SHIFT_2M may respectively control corresponding storage registers REG_21 to REG_2N.

An operation of the second shift register SHIFT_21 and the storage registers REG_21 to REG_24, which are described in the above-described example, may be equally applied to the other second shift registers SHIFT_22 to SHIFT_2M and the other storage registers REG_25 to REG_2N.

In an embodiment, the plurality of storage registers REG_1, REG_2, REG_11 to REG_1N, and REG_21 to REG_2N may respectively output stored training data REG_1_0, REG_2_0, REG_11_0 to REG_1N_0, and REG_21_0 to REG_2N_0 in response to a read enable signal and a second data strobe signal, which are provided from the memory controller 200.

Figure 7:
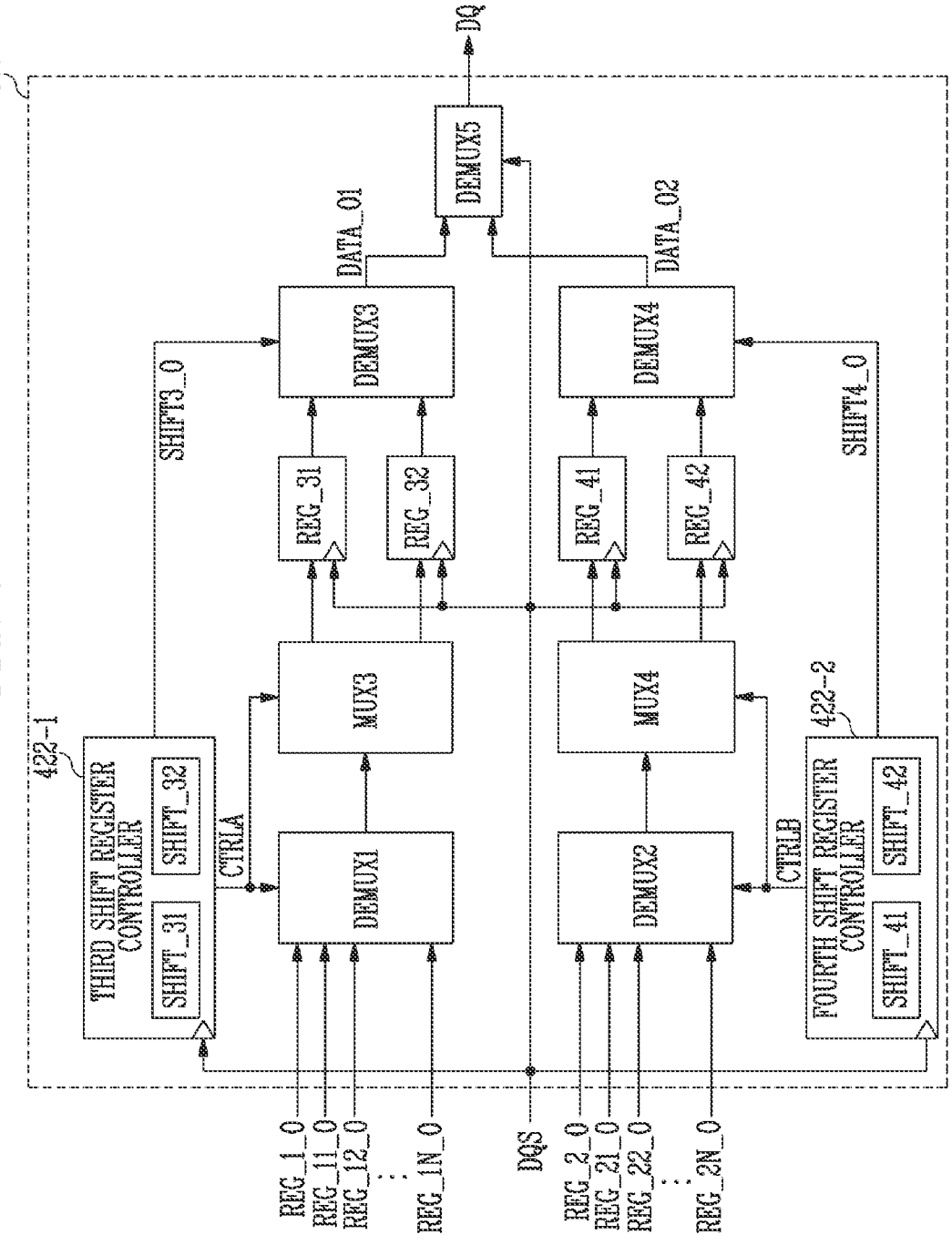
FIG. 7 is a diagram illustrating a second data input/output component in accordance with an embodiment of the present disclosure.

FIG. 7 is a diagram illustrating a second data input/output component 422 in accordance with an embodiment of the present disclosure.

Figure 8:
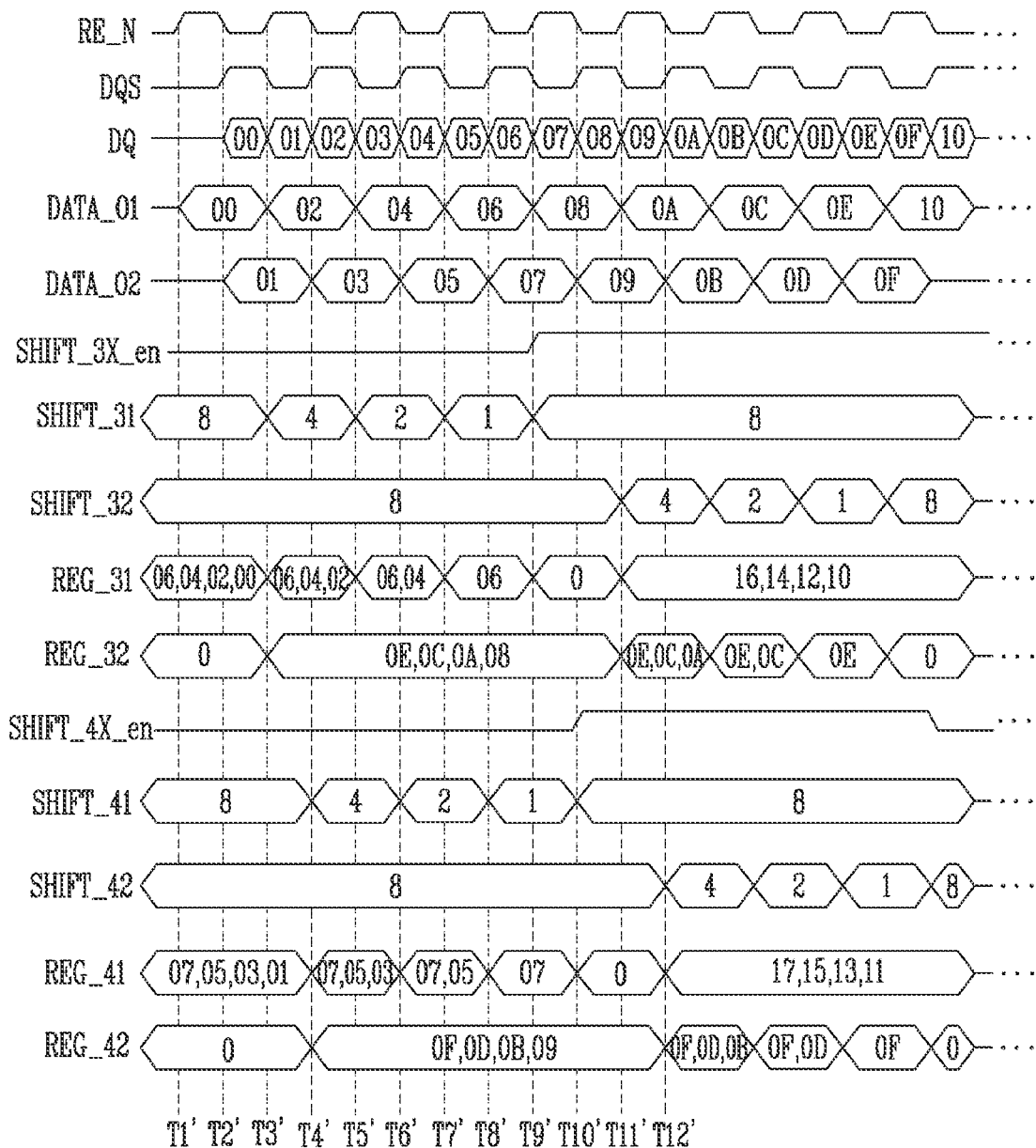
FIG. 8 is a timing diagram illustrating an operation of the second data input/output component in accordance with an embodiment of the present disclosure.

FIG. 8 is a timing diagram illustrating an operation of the second data input/output component 422 in accordance with an embodiment of the present disclosure.

Referring to FIGS. 7 and 8, the second data input/output component 422 may include a third shift register controller 422-1, a fourth shift register controller 422-2, a plurality of demultiplexers DEMUX1 to DEMUX5, a plurality of multiplexers MUX3 and MUX4, and a plurality of storage registers REG_31, REG_32, REG_41, and REG_42.

The third shift register controller 422-1 may include a plurality of third shift registers SHIFT_31 and SHIFT_32 which output a shift signal SHIFT3_0 in response to rising edges of a read enable signal RE_N and a second data strobe signal DQS, which are provided from the memory controller 200. For example, the third shift registers SHIFT_31 and SHIFT_32 may output the shift signal SHIFT3_0 and then sequentially shift stored bits. In an embodiment, the shift signal SHIFT3_0 may represent a value stored in the third shift registers SHIFT_31 and SHIFT_32. The third shift registers SHIFT_31 and SHIFT_32 may correspond to a register having a 4-bit size, but the present disclosure is not limited thereto.

Storage registers REG_31 and REG_32 may respectively store output data output from the first data input/output component 421. The output data may be training data which is stored in the first data input/output component 421 and then output. For example, a first demultiplexer DEMUX1 may provide output data REG_1_0 and REG_11_0 to REG_1N_0 under the control of the third shift register controller 422-1. Specifically, the third shift register controller 422-1 may provide the first demultiplexer DEMUX1 with a control signal CTRLA for outputting any of the output data REG_1_0 and REG_11_0 to REG_1N_0. For example, the first demultiplexer DEMUX1 may provide output data REG_1_0 to a third multiplexer MUX3 according to the control signal CTRLA. In another example, the first demultiplexer DEMUX1 may provide the third multiplexer MUX3 with data having a predetermined size by adding up some of the output data REG_11_0 to REG_1N_0 according to the control signal CTRLA. The predetermined size may be 32 bits, but the present disclosure is not limited thereto.

In addition, the third multiplexer MUX3 may provide the output data provided from the first demultiplexer DEMUX1 to a selected storage register among the plurality of storage registers REG_31 and REG_32 under the control of the third shift register controller 422-1. Specifically, the third shift register controller 422-1 may provide the third multiplexer MUX3 with a control signal CTRLA for providing data to any of the plurality of storage registers REG_31 and REG_32. For example, the third multiplexer MUX3 may provide data to a storage register which is storing a current value '0' among the plurality of storage registers REG_31 and REG_32 according to the control signal CTRLA. The storage registers REG_31 and REG_32 may store the output data received from the third multiplexer MUX3. The storage registers REG_31 and REG_32 may shift and output stored output data in response to rising edges of the second data strobe signal DQS. For example, a third demultiplexer MUX3 may output data in response to the shift signal SHIFT3_0 output from the plurality of third shift registers SHIFT_31 and SHIFT_32 among the data output from the plurality of storage registers REG_31 and REG_32.

The fourth shift register controller 422-2 may include a plurality of fourth shift registers SHIFT_41 and SHIFT_42 which output a shift signal SHIFT4_0 in response to falling edges of the read enable signal RE_N and the second data strobe signal DQS, which are provided from the memory controller 200. For example, the fourth shift registers SHIFT_41 and SHIFT_42 may output the shift signal SHIFT4_0 and then sequentially shift stored bits. In an embodiment, the shift signal SHIFT4_0 may represent a value stored in the fourth shift registers SHIFT_41 and SHIFT_42. The fourth shift registers SHIFT_41 and SHIFT_42 may correspond to a register having a 4-bit size, but the present disclosure is not limited thereto.

Storage registers REG_41 and REG_42 may respectively output data output from the first data input/output component 421. The output data may be training data which is stored in the first data input/output component 421 and then output. For example, a second demultiplexer DEMUX2 may provide output data REG_2_0 and REG_21_0 to REG_2N_0 under the control of the fourth shift register controller 422-2. Specifically, the fourth shift register controller 422-2 may provide the second demultiplexer DEMUX2 with a control signal CTRLB for outputting any of the output data REG_2_0 and REG_21_0 to REG_2N_0. For example, the second demultiplexer DEMUX2 may provide output data REG_2_0 to a fourth multiplexer MUX4 according to the control signal CTRLB. In another example, the second demultiplexer DEMUX2 may provide the fourth multiplexer MUX4 with data having a predetermined size by adding up some of output data REG_21_0 to REG_2N_0 according to the control signal CTRLB. The predetermined size may be 32 bits, but the present disclosure is not limited thereto.

In addition, the fourth multiplexer MUX4 may provide the output data provided from the second demultiplexer DEMUX2 to a selected storage register among the plurality of storage registers REG_41 and REG_42 under the control of the fourth shift register controller 422-2. Specifically, the fourth shift register controller 422-2 may provide the fourth multiplexer MUX4 with a control signal CTRLB for providing data to any of the plurality of storage registers REG_41 and REG_42. For example, the fourth multiplexer MUX4 may provide data to a storage register which is storing a current value '0' among the plurality of storage registers REG_41 and REG_42 according to the control signal CTRLB. The storage registers REG_41 and REG_42 may store output data received from the fourth multiplexer MUX4. The storage registers REG_41 and REG_42 may shift and output the stored output data in response to falling edges of the second data strobe signal DQS. For example, the fourth demultiplexer DEMUX4 may output data in response to the shift signal SHIFT4_0 output from the plurality of fourth shift registers SHIFT_41 and SHIFT_42 among the data output from the plurality of storage registers REG_41 and REG_42.

In an embodiment, a fifth demultiplexer DEMUX5 may output data output from the third demultiplexer DEMUX3 in response to a rising edge of the second data strobe signal DQS, or output data output from the fourth demultiplexer DEMUX4 in response to a falling edge of the second data strobe signal DQS. For example, the fifth demultiplexer DEMUX5 may output any of data which is shifted and then output from the third demultiplexer DEMUX3, and data which is shifted and then output from the fourth demultiplexer DEMUX4. When the second data strobe signal DQS has a rising edge, the fifth demultiplexer DEMUX5 may output the data which is shifted and then output from the third demultiplexer DEMUX3 through the input/output line DQ. When the second data strobe signal DQS has a falling edge, the fifth demultiplexer DEMUX5 may output the data which is shifted and then output from the fourth demultiplexer DEMUX4 through the input/output line DQ. In an embodiment, the data which is shifted and then output may have an 8-bit size, but the present disclosure is not limited thereto.

In an embodiment, the third shift register controller 422-1 may control the first demultiplexer DEMUX1 and the third multiplexer MUX3 to first store output data RGE_1_0 of the storage register REG_1 in a storage register REG_31. Accordingly, at T1', the storage register REG_31 may store the output data REG_1_0. The output data REG_1_0 may include training data 06, 04, 02, 00.

Also, in an embodiment, the fourth shift register controller 422-2 may control the second demultiplexer DEMUX2 and the fourth multiplexer MUX4 to first store output data REG_2_0 of the storage register REG_2 in a storage register REG_41. Accordingly, at T2', the storage register REG_41 may store the output data REG_2_0. The output data REG_2_0 may include training data 07, 05, 03, and 01.

After the read enable signal RE_N is toggled at T1', the second data strobe signal DQS may become a rising edge at T2'. At T2', the storage register REG_31 may shift and output data 00 among the stored data 06, 04, 02, and 00 in response to a rising edge of the second data strobe signal DQS. A third shift register SHIFT_31 stores '1000' as a binary data value, and therefore, the shift signal SHIFT3_0 of the third shift register SHIFT_31 may be 8. Since the second data strobe signal DQS has the rising edge, the fifth demultiplexer DEMUX5 may output the data 00 through the input/output line DQ. The third shift register SHIFT_31 outputs the shift signal SHIFT3_0 and then stores '0100' as a binary data value by shifting each bit. Therefore, the shift signal SHIFT3_0 of the third shift register SHIFT_31 may be changed to 4.

In addition, after the read enable signal RE_N is toggled at T3', the second data strobe signal DQS may become a rising edge at T4'. At T4', the storage register REG_31 may shift and output data 02 among the stored data 06, 04, and 02 in response to a rising edge of the second data strobe signal DQS. The third shift register SHIFT_31 stores '0100' as the binary data value, and therefore, the shift signal SHIFT3_0 of the third shift register SHIFT_31 may be 4. Since the second data strobe signal DQS has the rising edge, the fifth demultiplexer DEMUX5 may output the data 02 through the input/output line DQ. The third shift register SHIFT_31 outputs the shift signal SHIFT3_0 and then stores '0010' as a binary data value by shifting each bit. Therefore, the shift signal SHIFT3_0 of the third shift register SHIFT_31 may be changed to 2.

In addition, after the read enable signal RE_N is toggled at T5', the second data strobe signal DQS may become a rising edge at T6'. At T6', the storage register REG_31 may shift and output data 04 among the stored data 06 and 04 in response to a rising edge of the second data strobe signal DQS. The third shift register SHIFT_31 stores '0010' as the binary data value, and therefore, the shift signal SHIFT3_0 of the third shift register SHIFT_31 may be 2. Since the second data strobe signal DQS has the rising edge, the fifth demultiplexer DEMUX5 may output the data 04 through the input/output line DQ. The third shift register SHIFT_31 outputs the shift signal SHIFT3_0 and then stores '0001' as a binary data value by shifting each bit. Therefore, the shift signal SHIFT3_0 of the third shift register SHIFT_31 may be changed to 1.

In addition, after the read enable signal RE_N is toggled at T7', the second data strobe signal DQS may become a rising edge at T8'. At T8', the storage register REG_31 may shift and output stored data 06 in response to a rising edge of the second data strobe signal DQS. The third shift register SHIFT_31 stores '0001' as the binary data value, and therefore, the shift signal SHIFT3_0 of the third shift register SHIFT_31 may be 1. Since the second data strobe signal DQS has the rising edge, the fifth demultiplexer DEMUX5 may output the data 06 through the input/output line DQ. In addition, the third shift register controller 422-1 may change the third shift enable signal SHIFT_3X_en from a low level to a high level. The third shift register SHIFT_31 may be initialized to store '1000' as a binary data value. In addition, the third shift register controller 422-1 may control a third shift register SHIFT_32. Subsequently, after first data is output from another storage register REG_32, the storage register REG_31 may store output data 16, 14, 12, and 10 output from the first data input/output component 421 at T11'.

After the first data is output from another storage register REG_31, the storage register REG_32 may store output data output from the first data input/output component 421 at T3'. The storage register REG_32 may store output data having a predetermined size. For example, the storage register REG_32 may store training data 0E, 0C, 0A, and 08 output from the first data input/output component 421. The storage register REG_32 may shift and output the stored data in response to a rising edge of the second data strobe signal DQS.

As described above, the third shift register controller 422-1 can output data through the input/output line DQ by alternately controlling the third shift registers SHIFT_31 and SHIFT_32 and the storage registers REG_31 and REG_32.

In addition, after the read enable signal RE_N is toggled at T2', the second data strobe signal DQS may become a falling edge at T3'. At T3', the storage register REG_41 may shift and output data 01 among the stored data 07, 05, 03, 01 in response to a falling edge of the second data strobe signal DQS. The fourth shift register SHIFT_41 stores '1000' as the binary data value, and therefore, the shift signal SHIFT4_0 of the fourth shift register SHIFT_41 may be 8. Since the second data strobe signal DQS has the falling edge, the fifth demultiplexer DEMUX5 may output data 01 through the input/output line DQ. The fourth shift register SHIFT_41 outputs the shift signal SHIFT4_0 and then stores '0100' as a binary data value by shifting each bit. Therefore, the shift signal SHIFT4_0 of the fourth shift register SHIFT_41 may be changed to 4.

In addition, after the read enable signal RE_N is toggled at T4', the second data strobe signal DQS may become a falling edge at T5'. At T5', the storage register REG_41 may shift and output data 03 among the stored data 07, 05, and 03 in response to a falling edge of the second data strobe signal DQS. The fourth shift register SHIFT_41 stores '0100' as the binary data value, and therefore, the shift signal SHIFT4_0 of the fourth shift register SHIFT_41 may be 4. Since the second data strobe signal DQS has the falling edge, the fifth demultiplexer DEMUX5 may output the data 03 through the input/output line DQ. The fourth shift register SHIFT_41 outputs the shift signal SHIFT4_0 and then stores '0010' as a binary data value by shifting each bit. Therefore, the shift signal SHIFT4_0 of the fourth shift register SHIFT_41 may be changed to 2.

In addition, after the read enable signal RE_N is toggled at T6', the second data strobe signal DQS may become a falling edge at T7'. At T7', the storage register REG_41 may shift and output data 05 among the stored data 07 and 05 in response to a falling edge of the second data strobe signal DQS. The fourth shift register SHIFT_41 stores '0010' as the binary data value, and therefore, the shift signal SHIFT4_0 of the fourth shift register SHIFT_41 may be 2. Since the second data strobe signal DQS has the falling edge, the fifth demultiplexer DEMUX5 may output the data 05 through the input/output line DQ. The fourth shift register SHIFT_41 outputs the shift signal SHIFT4_0 and then stores '0001' as a binary data value by shifting each bit. Therefore, the shift signal SHIFT4_0 of the fourth shift register SHIFT_41 may be changed to 1.

In addition, after the read enable signal RE_N is toggled at T8', the second data strobe signal DQS may become a falling edge at T9'. At T9', the storage register REG_41 may shift and output stored data 07 in response to a falling edge of the second data strobe signal DQS. The fourth shift register SHIFT_41 stores '0001' as the binary data value, and therefore, the shift signal SHIFT4_0 of the fourth shift register SHIFT_41 may be 1. Since the second data strobe signal DQS has the falling edge, the fifth demultiplexer DEMUX5 may output the data 07 through the input/output line DQ. In addition, the fourth shift register controller 422-2 may change a fourth shift enable signal SHIFT_4X_en from the low level to the high level. The fourth shift register SHIFT_41 may store '1000' as a binary data value. Also, the fourth shift register controller 422-2 may control a fourth shift register SHIFT_42. Subsequently, after first data is output from another storage register REG_42, the storage register REG_41 may store output data 17, 15, 13, and 11 output from the first data input/output component 421 at T12'.

After first data is output from another storage register REG_41, the storage register REG_42 may store output data output from the first data input/output component 421 at T4'. The storage register REG_42 may store output data having a predetermined size. For example, the storage register REG_42 may store training data 0F, 0D, 0B, and 09 output from the first data input/output component 421. The storage register REG_42 may shift and output the stored data in response to a falling edge of the second data strobe signal DQS.

As described above, the fourth shift register controller 422-2 can output data through the input/output line DQ by alternately controlling the fourth shift registers SHIFT_41 and SHIFT-42 and the storage registers REG_41 and REG_42.

Figure 9:
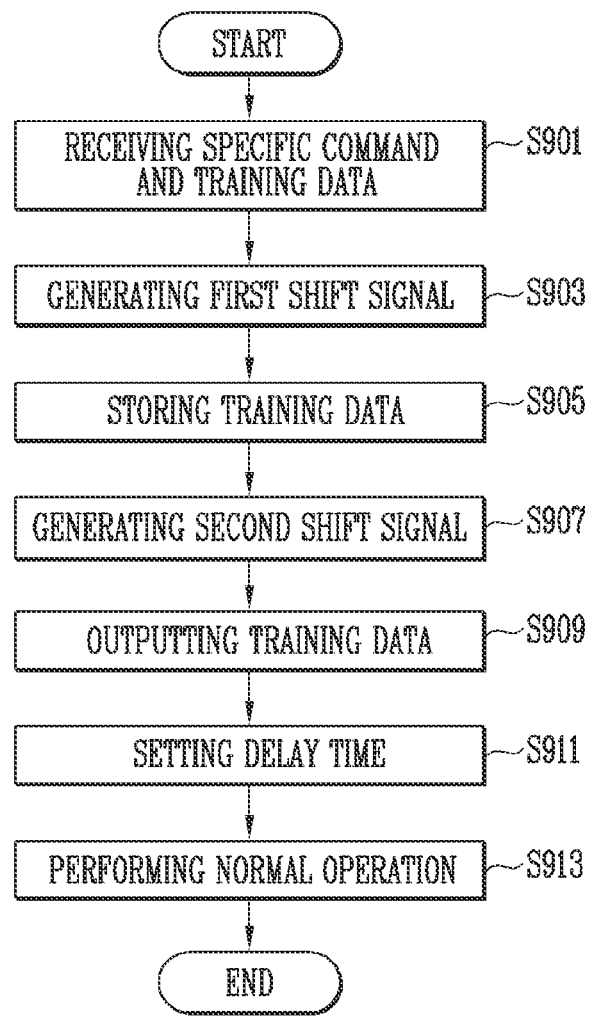
FIG. 9 is a diagram illustrating an operating method of a storage device in accordance with an embodiment of the present disclosure.

FIG. 9 is a diagram illustrating an operating method of a storage device 50 in accordance with an embodiment of the present disclosure.

The operating method shown in FIG. 9 may be performed by, for example, the storage device 50 described with reference to FIGS. 1 to 8.

In operation S901, the storage device may receive a specific command and training data.

In operation S903, the storage device 50 may generate a first shift signal according to a first data strobe signal in response to the specific command.

In operation S905, the storage device 50 may store, into the first data input/output component 421, the training data based on the first shift signal.

The storage device 50 may store the training data in a storage register corresponding to the first shift signal among a plurality of storage registers.

In operation S907, the storage device 50 may generate a second shift signal according to a read enable signal and a second data strobe signal.

The storage device 50 may store, into the second data input/output component 422, the training data output from the first data input/output component 421 according to the read enable signal and the second data strobe signal.

In operation S909, the storage device 50 may output, from the second data input/output component 422, the training data based on the second shift signal.

The storage device 50 may shift and output the training data stored with a predetermined size in response to the second shift signal.

In operation S911, the storage device 50 may set a delay time by comparing the training data input to the first data input/output component 421 with the training data output from the second data input/output component 422.

In operation S913, the storage device 50 may perform a write operation and a read operation, which are a normal operation, based on the set delay time.

Figure 10:
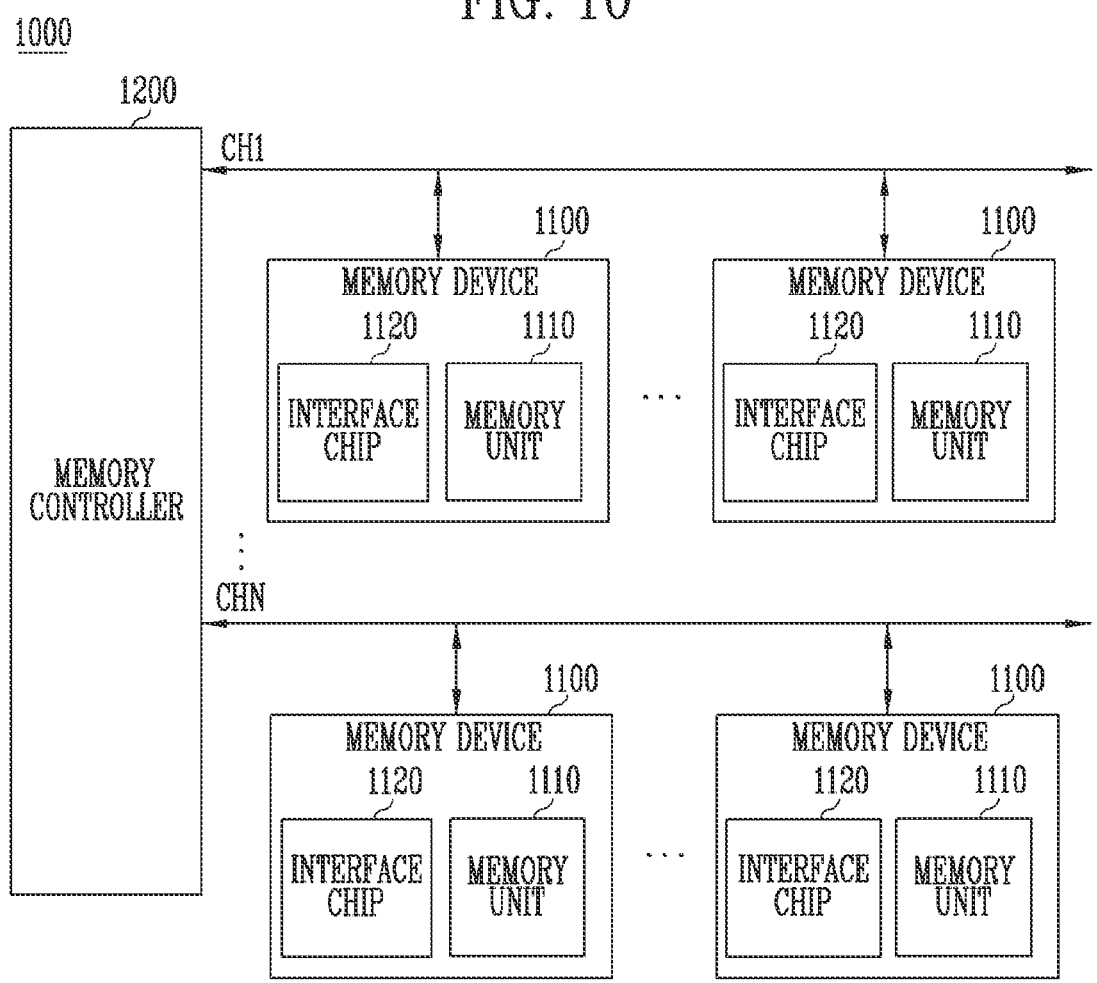
FIG. 10 is a diagram illustrating a storage device in accordance with another embodiment of the present disclosure.

FIG. 10 is a diagram illustrating a storage device 1000 in accordance with another embodiment of the present disclosure.

Referring to FIG. 10, the storage device 1000 may include a plurality of memory devices 1100 and a memory controller 1200. Each memory device 1100 may include a memory unit 1110 and an interface chip 1120. Each memory device 1100 may have the same structure as the memory device 100 described with reference to FIGS. 1 to 9, and operate in the same method as the memory device 100 described with reference to FIGS. 1 to 9. The memory unit 1110 may be configured with a plurality of memory chips. The interface chip 1120 may perform retiming between the plurality of memory chips and the memory controller 1200.

The memory devices 1100 may communicate with the memory controller 1200 through a plurality of channels CH1 to CHN. Memory devices 1100 connected to different channels CH1 to CHN may communicate with the memory controller 1200 independently from each other. In each of the channels CH1 to CHN, the memory controller 1200 may communicate data, a command, and an address with memory devices 1100 through a common channel. In each of the channels CH1 to CHN, the memory controller 1200 may exchange a control signal with the memory devices 1100 through the common channel. The control signal may include a command latch enable signal, an address latch enable signal, a read enable signal, a write enable signal, and a write prevention signal.

In each of the channels CH1 to CHN, the memory controller 1200 may communicate a chip enable signal, and a ready and busy signal with memory devices 1100 through different channels. In each of the channels CH1 to CHN, the memory controller 1200 may control the chip enable signal, to individually select memory devices 1100 and memory units 1110 in the respective memory devices 1100. Also, in each of the channels CH1 to CHN, the memory controller 1200 may identify whether memory devices 1100 and memory units 1110 in the respective memory devices 1100 are in a communicable state, based on the ready and busy signal.

Figure 11:
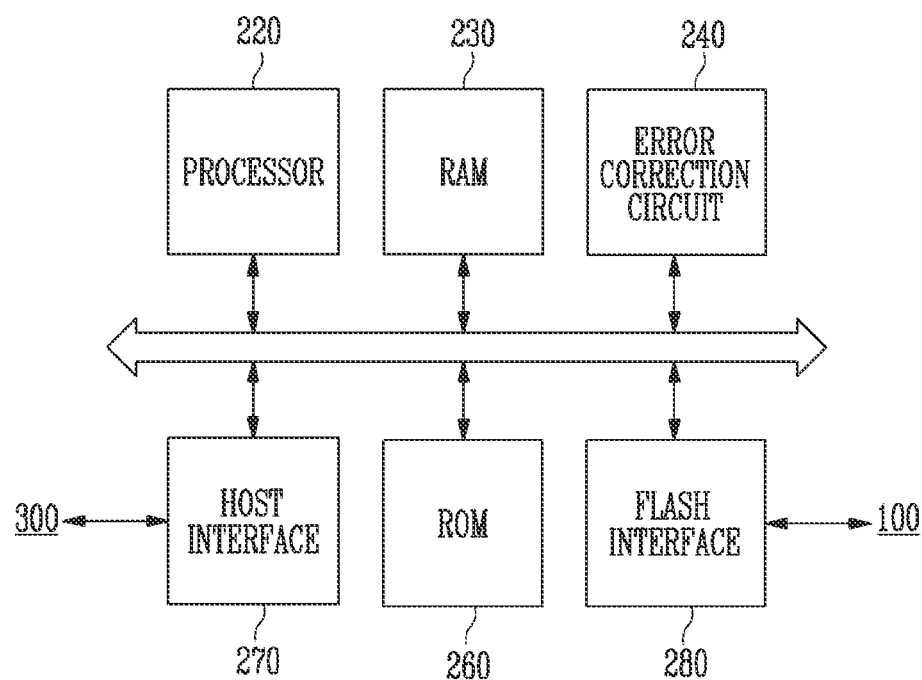
FIG. 11 is a diagram illustrating the memory controller shown in FIG. 1 in accordance with an embodiment of the present disclosure.

FIG. 11 is a diagram illustrating the memory controller 200 shown in FIG. 1 in accordance with an embodiment of the present disclosure.

Referring to FIGS. 1 and 11, the memory controller 200 may include a processor 220, a RAM 230, an error correction circuit 240, a ROM 250, a host interface 270, and a flash interface 280.

The processor 220 may control overall operations of the memory controller 200. The RAM 230 may be used as a buffer memory, a cache memory, a working memory, etc. of the memory controller 200.

The error correction circuit 240 may perform error correction. The error correction circuit 240 may perform error correction code (ECC) encoding on data to be written to the memory device through the flash interface 280. The ECC-encoded data may be transferred to the memory device through the flash interface 280. The error correction circuit 240 may perform ECC decoding on data received from the memory device through the flash interface 280. The error correction circuit 240 may be included as a component of the flash interface 280 in the flash interface 280.

The ROM 260 may store, in the form of firmware, various information required in an operation of the memory controller 200.

The memory controller 200 may communicate with an external device (e.g., the host 300, an application processor, or the like) through the host interface 270.

The memory controller 200 may communicate with the memory device 100 through the flash interface 280. The memory controller 200 may transmit a command, an address, a control signal, and the like to the memory device 100 through the flash interface 280, and receive data DATA. The flash interface 280 may include a NAND interface.

Figure 12:
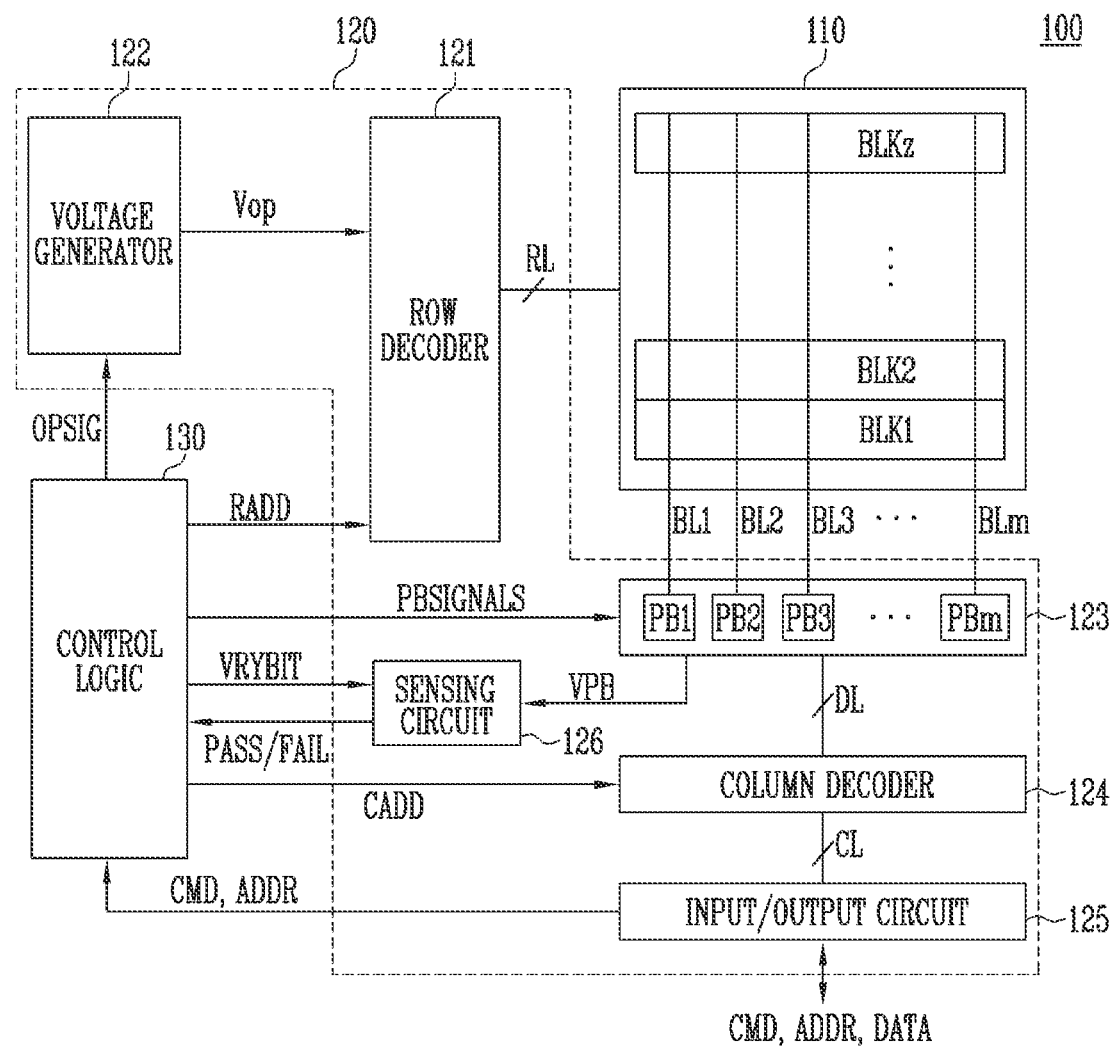
FIG. 12 is a diagram illustrating a memory device shown in FIG. 1 in accordance with an embodiment of the present disclosure.

FIG. 12 is a diagram illustrating a memory device 100 shown in FIG. 1 in accordance with an embodiment of the present disclosure.

Referring to FIG. 12, the memory device 100 may include a memory cell array 110, a peripheral circuit 120, and the control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLm or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic. The row decoder 121 receives a row address RADD from the control logic 130.

The row decoder 121 decodes the row address RADD. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines connected to the selected memory blocks.

The voltage generator 122 operates under the control of the control logic 130. The voltage generator 122 generates a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to mth page buffers PB1 to PBm. The first to mth page buffers PB1 to PBm are connected to the memory cell array 110 respectively through first to mth bit lines BL1 to BLm. The first to mth bit lines BL1 to BLm operate under the control of the control logic 130. Specifically, the first to mth bit lines BL1 to BLm may operate in response to page buffer control signals PBSIGNALS. For example, the first to mth page buffers PB1 to PBm may temporarily store data received through the first to mth bit lines BL1 to BLm, or sense a voltage or current of the bit lines BL1 to BLm in a read or verify operation.

Specifically, in a program operation, the first to mth page buffers PB1 to PBm may transfer data DATA received through the input/output circuit 125 to selected memory cells through the first to mth bit lines BL1 to BLm, when a program voltage is applied to a selected word line. Memory cells of a selected page are programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained. In a program verify operation, the first to mth page buffers PB1 to PBm read page data from the selected memory cells through the first to mth bit lines BL1 to BLm.

In a read operation, the first to mth page buffers PB1 to PBm read data DATA from the memory cells of the selected page through the first to mth bit lines BL1 to BLm, and output the read data DATA to the input/output circuit 125 under the control of the column decoder 124.

In an erase operation, the first to mth page buffers PB1 to PBm may float the first to mth bit lines BL1 to BLm.

The column decoder 124 may communicate data between the input/output circuit 125 and the page buffer group 123 in response to a column address CADD. For example the column decoder 124 may communicate data with the first to mth page buffers PB1 to PBm through data lines DL, or communicate data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In an embodiment, the input/output circuit 125 may receive a command CMD, an address ADDR, and data DATA, which are input from the memory controller 200, or output data DATA to the memory controller 200.

In a read operation or verify operation, the sensing circuit 125 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS or FAIL.

Figure 13:
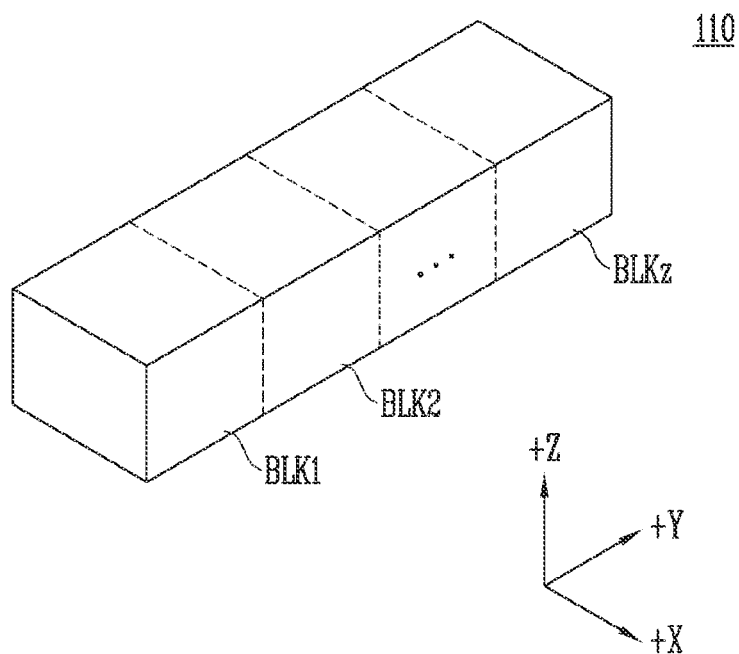
FIG. 13 is a diagram illustrating a memory cell array shown in FIG. 12 in accordance with an embodiment of the present disclosure.

FIG. 13 is a diagram illustrating a memory cell array 110 shown in FIG. 12 in accordance with an embodiment of the present disclosure.

Referring to FIG. 13, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 14 and 15.

Figure 14:
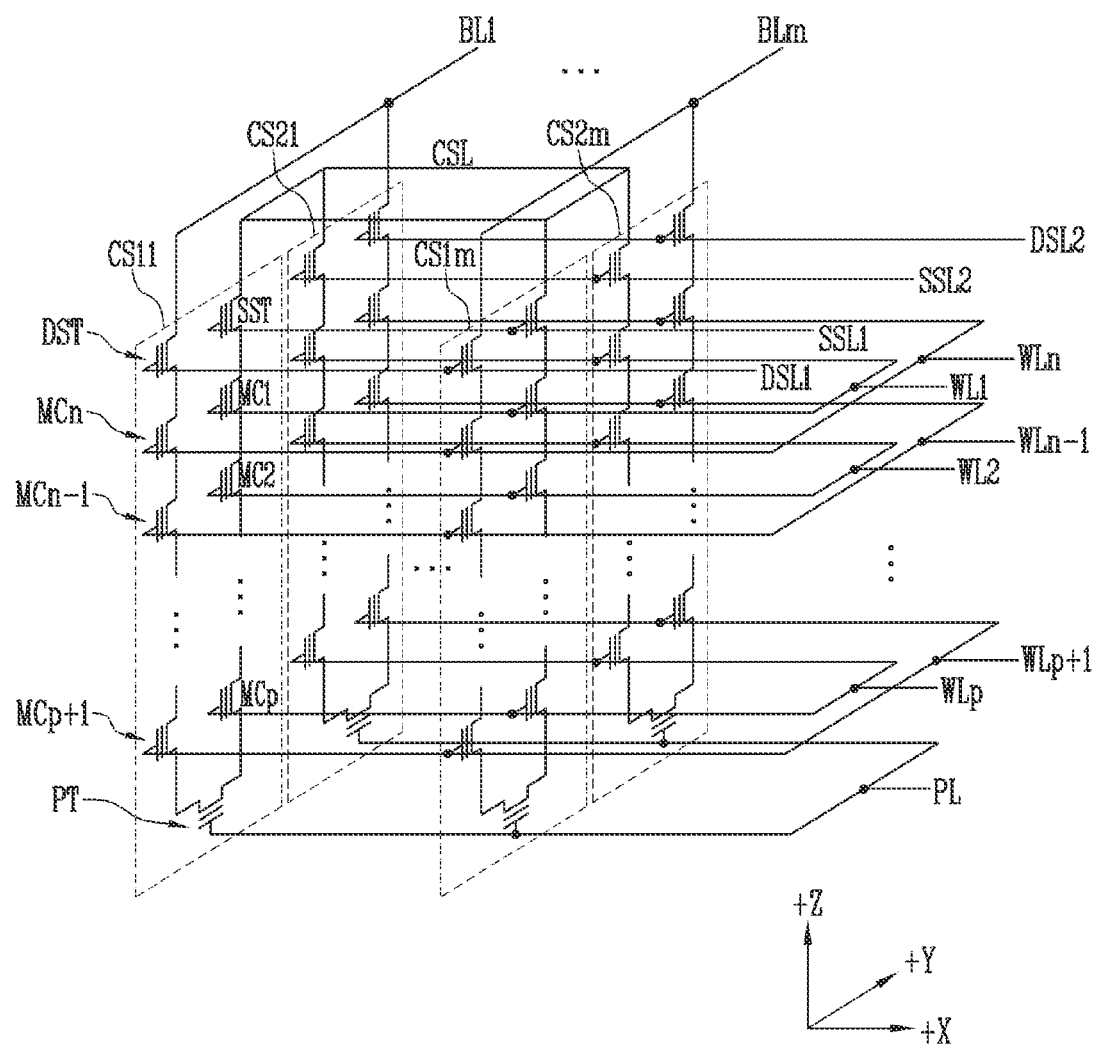
FIG. 14 is a circuit diagram illustrating a memory block among memory blocks shown in FIG. 13 in accordance with an embodiment of the present disclosure.

FIG. 14 is a circuit diagram illustrating a memory block BLKa among the memory blocks BLK1 to BLKz shown in FIG. 13 in accordance with an embodiment of the present disclosure.

Referring to FIG. 14, the memory block BLKa may include a plurality of memory cell strings CS11 to CS1m and CS21 to CS2m. In an embodiment, each of the plurality of memory cell strings CS11 to CS1m and CS21 to CS2m may be formed in a 'U' shape. In the memory block BLKa, m memory cell strings are arranged in a row direction (i.e., a +X direction). FIG. 14 illustrates two memory cell strings arranged in a column direction (i.e., a +Y direction). However, this is for convenience of description, and it will be understood that three memory cell strings may be arranged in the column direction.

Each of the plurality of memory cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each memory cell string. In an embodiment, a pillar for providing at least one of the channel layer, the tunneling insulating layer, the charge storage layer, and the blocking insulating layer may be provided in each memory cell string.

The source select transistor SST of each memory cell string is connected between a common source line CSL and memory cells MC1 to MCp.

In an embodiment, the source select transistors of memory cell strings arranged on the same row are connected to a source select line extending in the row direction, and the source select transistors of memory cell strings arranged on different rows are connected to different source select lines. In FIG. 14, the source select transistors of the memory cell strings CS11 to CS1m on a first row are connected to a first source select line SSL1. The source select transistors of the memory cell strings CS21 to CS2m on a second row are connected to a second source select line SSL2.

In another embodiment, the source select transistors of the memory cell strings CS11 to CS1m and CS21 to CS2m may be commonly connected to one source select line.

The first to nth memory cells MC1 to MCn of each memory cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each memory cell string are connected to first to nth word lines WL1 to WLn, respectively.

A gate of the pipe transistor PT of each memory cell string is connected to a pipe line PL.

The drain select transistor DST of each memory cell string is connected between a corresponding bit line and the memory cells MCp+1 to MCn. Memory cell strings arranged in the row direction are connected to a drain select line extending in the row direction. The drain select transistors of the memory cell strings CS11 to CS1m on the first row are connected to a first drain select line DSL1. The drain select transistors of the memory cell strings CS21 to CS2m on the second row are connected to a second drain select line DSL2.

Memory cell strings arranged in the column direction are connected to a bit line extending in the column direction. In FIG. 14, the memory cell strings CS11 and CS21 on a first column are connected to a first bit line BL1. The memory cell strings CS1m and CS2m on an mth column are connected to an mth bit line BLm.

Memory cells connected to the same word line in the memory cell strings arranged in the row direction constitute one page. For example, memory cells connected to the first word line WL1 in the memory cell strings CS11 to CS1m on the first row constitute one page. Memory cells connected to the first word line WL1 in the memory cell strings CS21 to CS2m on the second row constitute another page. When any of the drain select lines DSL1 and DSL2 is selected, memory cell strings arranged in one row direction may be selected. When any of the word lines WL1 to WLn is selected, one page may be selected in the selected memory cell strings.

In another embodiment, even bit lines and odd bit lines may be provided instead of the first to mth bit lines BL1 to BLm. In addition, even-numbered memory cell strings among the memory cell strings CS11 to CS1m or CS21 to CS2m arranged in the row direction may be connected to the even bit lines, respectively, and odd-numbered memory cell strings among the memory cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells controls a voltage applied to the dummy word lines connected to the respective dummy memory cells, so that the dummy memory cells can have the required threshold voltage.

Figure 15:
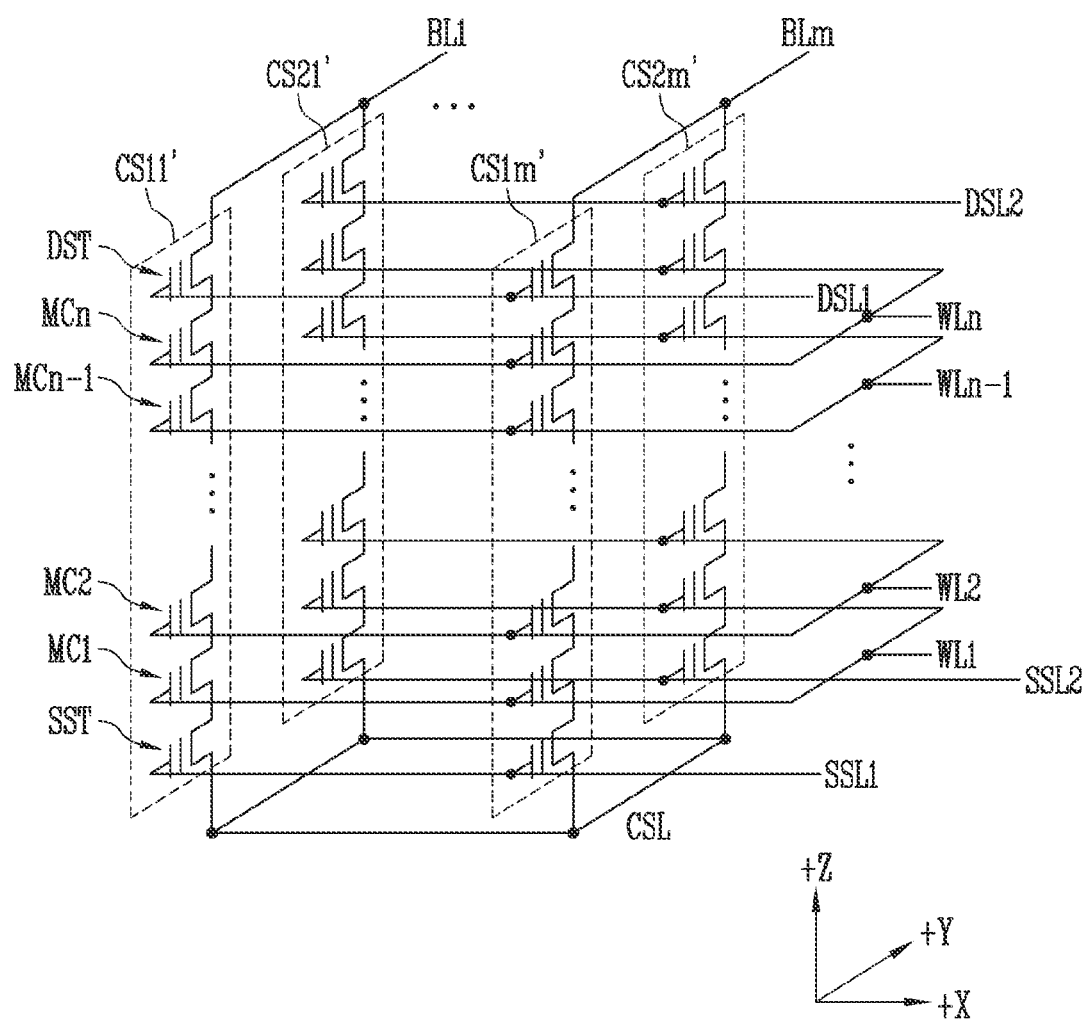
FIG. 15 is a circuit diagram illustrating a memory block among the memory blocks shown in FIG. 13 in accordance with an embodiment of the present disclosure.

FIG. 15 is a circuit diagram illustrating a memory block BLKb among the memory blocks BLK1 to BLKz shown in FIG. 13 in accordance with an embodiment of the present disclosure.

Referring to FIG. 15, the memory block BLKb may include a plurality of memory cell strings CS11' to CS1m' and CS21' to CS2m'. Each of the plurality of memory cell strings CS11' to CS1m' and CS21' to CS2m' extends along the +Z direction. Each of the plurality of memory cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each memory cell string is connected between a common source line CSL and the memory cells MC1 to MCn. The source select transistors of memory cell strings arranged on the same row are connected to the same source select line. The source select transistors of the memory cell strings CS11' to CS1m' arranged on a first row are connected to a first source select line SSL1. Source select transistors of the memory cell strings CS21' to CS2m' arranged on a second row are connected to a second source select line SSL2. In another embodiment, the source select transistors of the memory cell strings CS11' to CS1m' and CS21' to CS2m' may be commonly connected to one source select line.

The first to nth memory cells MC1 to MCn of each memory cell string are connected in series between the source select transistor SST and the drain select transistor DST. Gate electrodes of the first to nth memory cells MC1 to MCn are connected to first to nth word lines WL1 to WLn, respectively.

The drain select transistor DST of each memory cell string is connected between a corresponding bit line and the memory cells MC1 to MCn. The drain select transistors of memory cell strings arranged in the row direction are connected to a drain select line extending in the row direction. The drain select transistors of the memory cell strings CS11' to CS1m' on the first row are connected to a first drain select line DSL1. The drain select transistors of the memory cell strings CS21' to CS2m' on the second row are connected to a second drain select line DSL2.

Consequently, the memory block BLKb of FIG. 15 has a circuit similar to that of the memory block BLKa of FIG. 14, except that the pipe transistor PT is excluded from each memory cell string in FIG. 15.

In another embodiment, even bit lines and odd bit lines may be provided instead of the first to mth bit lines BL1 to BLm. In addition, even-numbered memory cell strings among the memory cell strings CS11' to CS1m' or CS21' to CS2m' arranged in the row direction may be connected to the even bit lines, respectively, and odd-numbered memory cell strings among the memory cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 16:
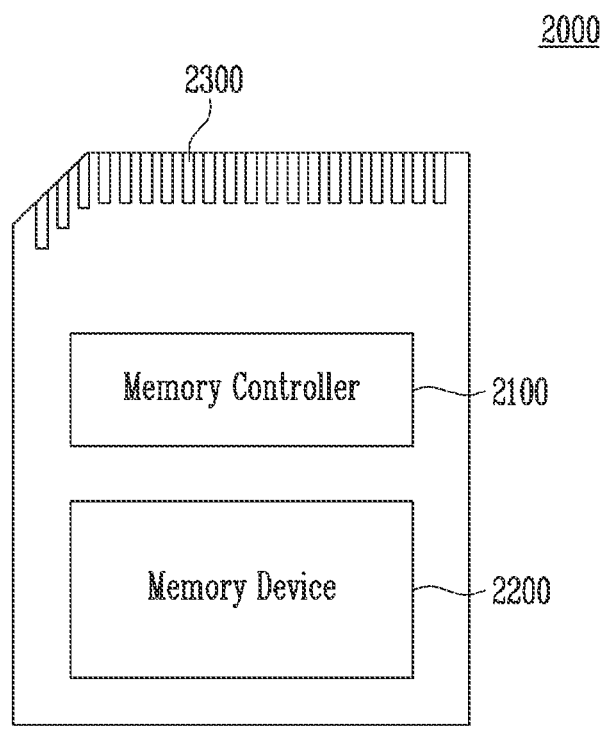
FIG. 16 is a block diagram illustrating a memory card system to which the storage device is applied in accordance with an embodiment of the present disclosure.

FIG. 16 is a block diagram illustrating a memory card system 2000 to which the storage device is applied in accordance with an embodiment of the present disclosure.

Referring to FIG. 16, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 1.

The memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. The memory controller 2100 may communicate with the external device through at least one of various communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. The connector 2300 may be defined by at least one of the above-described various communication protocols.

The memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (e.g., SM and SMC), a memory stick, a Multi-Media Card (e.g., MMC, RS-MMC, MMCmicro and eMMC), a secure digital (SD) card (e.g., SD, miniSD, microSD and SDHC), and a Universal Flash Storage (UFS).

Figure 17:
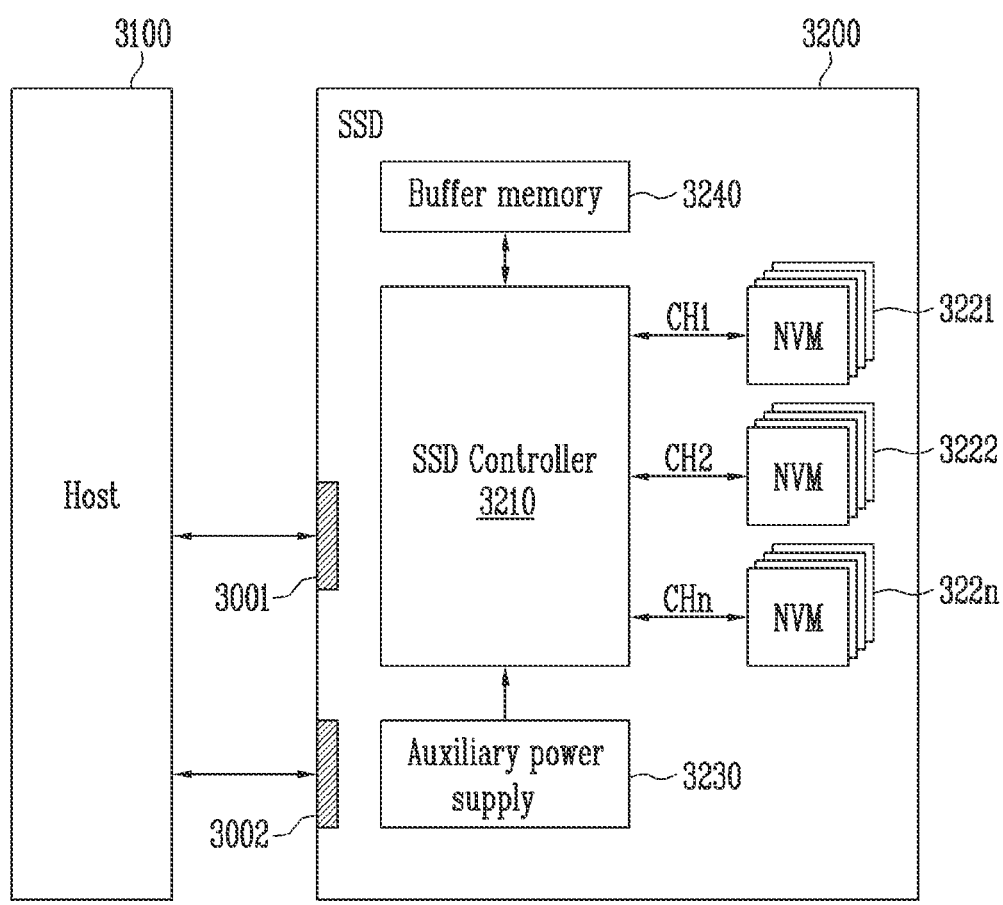
FIG. 17 is a block diagram illustrating a Solid State Drive (SSD) system to which the storage device is applied in accordance with an embodiment of the present disclosure.

FIG. 17 is a block diagram illustrating a Solid State Drive (SSD) system 3000 to which the storage device is applied in accordance with an embodiment of the present disclosure.

Referring to FIG. 17, the SSD system 3000 includes a host 3100 and an SSD 3200. The SSD 3200 exchanges a signal with the host 3100 through a signal connector 3001, and receives power through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal received from the host 3100. The signal may be a signal based on an interface between the host 3100 and the SSD 3200. For example, the signal may be a signal defined by at least one of communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power to the SSD 3200. The auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 18:
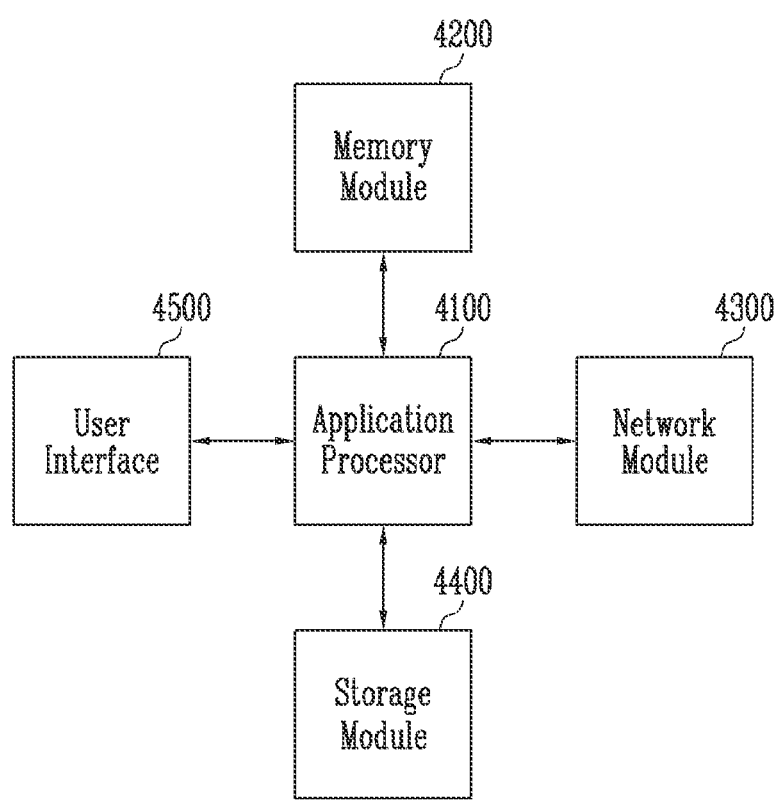
FIG. 18 is a block diagram illustrating a user system to which the storage device is applied in accordance with an embodiment of the present disclosure.

FIG. 18 is a block diagram illustrating a user system 4000 to which the storage device is applied in accordance with an embodiment of the present disclosure.

Referring to FIG. 18, the user system 4000 includes an application processor 4100, a memory module 4200, a network module 4300, a storage module 4400, and a user interface 4500.

The application processor 4100 may drive components included in the user system 4000, an operating system (OS), a user program, or the like. The application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 4100 and the memory module 4200 may be provided as one semiconductor package by being packaged based on a Package on Package (PoP).

The network module 4300 may communicate with external devices. The network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 4300 may be included in the application processor 4100.

The storage module 4400 may store data. For example, the storage module 4400 may store data received from the application processor 4100. Alternatively, the storage module 4400 may transmit data stored therein to the application processor 4100. The storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 4400 may be provided as a removable drive such as a memory card of the user system 4000 or an external drive.

The storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. The user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there is provided a storage device capable of controlling the input/output of data at a high frequency, and an operating method of the storage device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

The embodiments of the present disclosure have been described in the drawings and specification. Although specific terminologies are used here, those are only to describe the embodiments of the present disclosure. Therefore, the present disclosure should not be restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. Furthermore, the embodiments may be combined to form additional embodiments.

What is claimed is:

1. A storage device comprising:
   a memory device; and
   a memory controller configured to control the memory device and provide the memory device with a command,
   wherein the memory device includes:
   a memory unit; and an interface chip configured to perform a training operation in response to the command by:
  generating a shift signal corresponding to data stored in one of a plurality of first shift registers according to a first data strobe signal provided from the memory controller, and
  storing, based on the shift signal, training data provided from the memory controller in one of a plurality of first storage registers.

2. The storage device of claim 1, wherein the interface chip includes:
  a command decoder configured to sense the command and output, in response to the command, a training operation control signal to perform the training operation; and
  a training operation controller configured to control a write operation and a read operation, each of which is the training operation, according to the training operation control signal.

3. The storage device of claim 2, wherein the command decoder is further configured to block, in response to the command, the command and the training data for the memory unit in order not to transmit the command and the training data to the memory unit.

4. The storage device of claim 2, wherein the training operation controller includes a first data input/output component configured to:
  generate the shift signal according to the first data strobe signal, and
  store the training data in a storage register corresponding to the shift signal.

5. The storage device of claim 4, wherein the first data input/output component includes:
  a first shift register controller configured to control the plurality of first shift registers, each of which outputs a first shift signal in response to a rising edge of the first data strobe signal;
  a second shift register controller configured to control a plurality of second shift registers, each of which outputs a second shift signal in response to a falling edge of the first data strobe signal;
  the plurality of first storage registers each configured to store the training data based on a corresponding first shift signal among first shift signals output from the plurality of first shift registers; and
  a plurality of second storage registers each configured to store the training data based on a corresponding second shift signal among second shift signals output from the plurality of second shift registers.

6. The storage device of claim 5, wherein each of the plurality of first shift registers is configured to sequentially shift stored bits after the outputting of the corresponding first shift signal, and
  wherein each of the plurality of second shift registers is configured to sequentially shift stored bits after the outputting of the corresponding second shift signal.

7. The storage device of claim 6,
  wherein the first shift register controller controls, when the bits stored in a currently controlled first shift register among the plurality of first shift registers represent a predetermined value, another first shift register among the plurality of first shift registers, and
  wherein the second shift register controller controls, when the bits stored in a currently controlled second shift register among the plurality of second shift registers represent a predetermined value, another second shift register among the plurality of second shift registers.

8. The storage device of claim 5, wherein the first data input/output component further includes:
  a first multiplexer configured to output the training data to a first storage register among the plurality of first storage registers in response to the first shift signal; and
  a second multiplexer configured to output the training data to a second storage register among the plurality of second storage registers in response to the second shift signal.

9. The storage device of claim 5, wherein the first data input/output component further includes:
  a third storage register configured to store the training data, which has a predetermined size, in response to the rising edge of the first data strobe signal; and
  a fourth storage register configured to store the training data, which has the predetermined size, in response to the falling edge of the first data strobe signal.

10. The storage device of claim 4, wherein the training operation controller further includes a second data input/output component configured to:
  receive and store therein the training data, which has a predetermined size and is output from the first data input/output component,
  generate the shift signal according to a read enable signal and a second data strobe signal, which are provided from the memory controller, and
  shift and output the training data, which is stored therein, in response to the shift signal.

11. The storage device of claim 10, wherein the second data input/output component includes:
  a third shift register controller configured to control a plurality of third shift registers, each of which outputs a third shift signal in response to rising edges of the read enable signal and the second data strobe signal;
  a fourth shift register controller configured to control a plurality of fourth shift registers, each of which outputs a fourth shift signal in response to falling edges of the read enable signal and the second data strobe signal;
  a plurality of third storage registers each configured to store the training data output from the first data input/output component and configured to shift and output the training data, which is stored therein, in response to the rising edge of the second data strobe signal; and
  a plurality of fourth storage registers each configured to store the training data output from the first data input/output component and configured to shift and output the training data, which is stored therein, in response to the falling edge of the second data strobe signal.

12. The storage device of claim 11, wherein each of the plurality of third shift registers is configured to sequentially shift stored bits after the outputting of the third shift signal, and
  wherein each of the plurality of fourth shift registers is configured to sequentially shift stored bits after the outputting of the fourth shift signal.

13. The storage device of claim 11, wherein the second data input/output component further includes:
  a first demultiplexer configured to provide the training data, which is output from the first data input/output component, under a control of the third shift register controller;
  a third multiplexer configured to provide the training data, which is provided from the first demultiplexer, to a selected third storage register among the plurality of third storage registers under the control of the third shift register controller;

a second demultiplexer configured to provide the training data, which is output from the first data input/output component, under a control of the fourth shift register controller; and a fourth multiplexer configured to provide the training data, which is provided from the second demultiplexer, to a selected fourth storage register among the plurality of fourth storage registers under the control of the fourth shift register controller.

14. The storage device of claim 11, wherein the second data input/output component further includes:

a third demultiplexer configured to output the training data, which is among the training data output from the plurality of third storage registers, in response to a corresponding third shift signal among third shift signals output from the plurality of third shift registers;

a fourth demultiplexer configured to output the training data, which is among the training data output from the plurality of fourth storage registers, in response to a corresponding fourth shift signal among fourth shift signals output from the plurality of fourth shift registers; and a fifth demultiplexer configured to output the training data, which is output from the third demultiplexer, in response to the rising edge of the second data strobe signal or output the training data, which is output from the fourth demultiplexer, in response to the falling edge of the second data strobe signal.

15. The storage device of claim 10, wherein the training operation controller is further configured to:

set a delay time by comparing the training data stored in the first data input/output component with the training data output from the second data input/output component, and perform a write operation and a read operation, each of which is a normal operation, based on the set delay time.

16. A method for operating a storage device, the method comprising:

receiving a command and training data;

generating a first shift signal according to a first data strobe signal in response to the command;

storing the training data based on the first shift signal;

generating a second shift signal according to a read enable signal and a second data strobe signal; and outputting the stored training data based on the second shift signal.

17. The method of claim 16, wherein the training data is stored in a storage register corresponding to the first shift signal among a plurality of storage registers.

18. The method of claim 16, further comprising storing the training data with a predetermined size according to the read enable signal and the second data strobe signal.

19. The method of claim 18, wherein the outputting of the stored training data includes shifting and outputting the training data stored with the predetermined size in response to the second shift signal.

20. An operating method of a memory device, the operating method comprising:

sequentially storing a data sequence into a first register circuitry according to a first shift signal, which is output from a first shift register and has a changing value according to a data strobe signal, during a write training operation;

moving the data sequence from the first register circuitry to a second register circuitry during a read training operation; and sequentially outputting the data sequence from the second register circuitry according to a second shift signal, which is output from a second shift register and has a changing value according to the data strobe signal, during the read training operation.

* * * * *